United States Patent
Hitchcock et al.

(10) Patent No.: US 9,590,193 B2
(45) Date of Patent: Mar. 7, 2017

(54) POLYMER DIODE

(71) Applicant: Parker-Hannifin Corporation, Cleveland, OH (US)

(72) Inventors: Roger N. Hitchcock, San Leandro, CA (US); Thomas Kridl, Los Altos, CA (US); Xina Quan, Saratoga, CA (US); Mikyong Yoo, Palo Alto, CA (US); Fang Yuan, San Jose, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 14/437,741

(22) PCT Filed: Oct. 24, 2013

(86) PCT No.: PCT/US2013/066504
§ 371 (c)(1),
(2) Date: Apr. 22, 2015

(87) PCT Pub. No.: WO2014/066576
PCT Pub. Date: May 1, 2014

(65) Prior Publication Data
US 2015/0295175 A1    Oct. 15, 2015

Related U.S. Application Data

(60) Provisional application No. 61/717,780, filed on Oct. 24, 2012.

(51) Int. Cl.
| | |
|---|---|
| *H01L 51/00* | (2006.01) |
| *H01L 51/05* | (2006.01) |
| *H01L 51/50* | (2006.01) |

(52) U.S. Cl.
CPC ........ *H01L 51/008* (2013.01); *H01L 51/0034* (2013.01); *H01L 51/0575* (2013.01); *H01L 51/5032* (2013.01); *H01L 51/5024* (2013.01)

(58) Field of Classification Search
CPC combination set(s) only.
See application file for complete search history.

(56) References Cited

U.S. PATENT DOCUMENTS

| | | | |
|---|---|---|---|
| 2,430,013 | A | 11/1947 | Hansell |
| 2,967,914 | A | 1/1961 | Pye |

(Continued)

FOREIGN PATENT DOCUMENTS

| | | | |
|---|---|---|---|
| CA | 2329804 | A1 | 11/1999 |
| CA | 2330384 | A1 | 11/1999 |

(Continued)

OTHER PUBLICATIONS

International Search Report for PCT/US2013/0066504, dated Feb. 4, 2014 (3 pages).

(Continued)

*Primary Examiner* — Kyoung Lee
*Assistant Examiner* — Ratisha Mehta
(74) *Attorney, Agent, or Firm* — K&L Gates LLP

(57) ABSTRACT

The present invention provides flexible polymer diodes in the form of a printable polymer sandwich configuration similar to that found in electroactive polymer transducers. The inventive flexible polymer diodes comprise a dielectric layer sandwiched between a pair of electrodes. With appropriate optional additives introduced in the electrode formulation and the proper electrical properties in the electrode, a device may be constructed which allows current to pass through for only one polarity of applied voltage.

19 Claims, 19 Drawing Sheets

(56) References Cited

U.S. PATENT DOCUMENTS

| | | |
|---|---|---|
| 3,050,034 A | 8/1962 | Benton |
| 3,056,932 A | 10/1962 | Wood |
| 3,303,750 A | 2/1967 | Powell |
| 3,304,773 A | 2/1967 | Rogallo |
| 3,400,281 A | 9/1968 | Malik |
| 3,403,234 A | 9/1968 | Barnes, Jr. et al. |
| 3,463,942 A | 8/1969 | Mellon |
| 3,509,714 A | 5/1970 | Walton |
| 3,516,846 A | 6/1970 | Matson |
| 3,539,841 A | 11/1970 | Riff |
| 3,558,936 A | 1/1971 | Horan |
| 3,606,241 A | 9/1971 | Bornholdt |
| 3,699,963 A | 10/1972 | Zaffaroni |
| 3,783,480 A | 1/1974 | Booe |
| 3,798,473 A | 3/1974 | Murayama et al. |
| 3,801,839 A | 4/1974 | Yo |
| 3,816,774 A | 6/1974 | Ohnuki et al. |
| 3,821,967 A | 7/1974 | Sturman et al. |
| 3,832,580 A | 8/1974 | Yamamuro et al. |
| 3,851,363 A | 12/1974 | Booe |
| 3,903,733 A | 9/1975 | Murayama et al. |
| 3,935,485 A | 1/1976 | Yoshida et al. |
| 3,940,637 A | 2/1976 | Ohigashi et al. |
| 3,943,614 A | 3/1976 | Yoshikawa et al. |
| 3,947,644 A | 3/1976 | Uchikawa |
| 3,965,757 A | 6/1976 | Barrus |
| 4,011,474 A | 3/1977 | O'Neill |
| 4,028,566 A | 6/1977 | Franssen et al. |
| 4,051,395 A | 9/1977 | Taylor |
| 4,056,742 A | 11/1977 | Tibbetts |
| 4,088,915 A | 5/1978 | Kodama |
| 4,089,927 A | 5/1978 | Taylor |
| 4,127,749 A | 11/1978 | Atoji et al. |
| 4,140,936 A | 2/1979 | Bullock |
| 4,155,950 A | 5/1979 | Berezuk et al. |
| 4,158,787 A | 6/1979 | Forward |
| 4,170,742 A | 10/1979 | Itagaki et al. |
| 4,190,336 A | 2/1980 | Frank et al. |
| 4,216,403 A | 8/1980 | Krempl et al. |
| 4,227,347 A | 10/1980 | Tam |
| 4,234,813 A | 11/1980 | Iguchi et al. |
| 4,236,416 A | 12/1980 | Barcita |
| 4,240,535 A | 12/1980 | Pierce et al. |
| 4,245,815 A | 1/1981 | Willis |
| 4,257,594 A | 3/1981 | Conrey et al. |
| 4,266,339 A | 5/1981 | Kalt |
| 4,283,461 A | 8/1981 | Wooden et al. |
| 4,283,649 A | 8/1981 | Heinouchi |
| 4,284,921 A | 8/1981 | Lemonon et al. |
| 4,290,983 A | 9/1981 | Sasaki et al. |
| 4,297,394 A | 10/1981 | Wooden et al. |
| 4,315,433 A | 2/1982 | Edelman et al. |
| 4,322,877 A | 4/1982 | Taylor |
| 4,326,762 A | 4/1982 | Hockenbrock et al. |
| 4,330,730 A | 5/1982 | Kurz et al. |
| 4,342,936 A | 8/1982 | Marcus et al. |
| 4,344,743 A | 8/1982 | Bessman et al. |
| 4,346,505 A | 8/1982 | Lemonon et al. |
| 4,363,991 A | 12/1982 | Edelman |
| 4,376,302 A | 3/1983 | Miller |
| 4,384,394 A | 5/1983 | Lemonon et al. |
| 4,387,318 A | 6/1983 | Kolm et al. |
| 4,400,634 A | 8/1983 | Micheron |
| 4,401,911 A | 8/1983 | Ravinet et al. |
| 4,404,490 A | 9/1983 | Taylor et al. |
| 4,413,202 A | 11/1983 | Krempl et al. |
| 4,433,359 A | 2/1984 | Hamabe et al. |
| 4,434,452 A | 2/1984 | Hamabe et al. |
| 4,435,667 A | 3/1984 | Kolm et al. |
| 4,442,372 A | 4/1984 | Roberts |
| 4,469,920 A | 9/1984 | Murphy |
| 4,469,978 A | 9/1984 | Hamada et al. |
| 4,472,255 A | 9/1984 | Millington et al. |
| 4,473,806 A | 9/1984 | Johnston |
| 4,500,377 A | 2/1985 | Broussoux et al. |
| 4,518,555 A | 5/1985 | Ravinet et al. |
| 4,566,135 A | 1/1986 | Schmidt |
| 4,588,998 A | 5/1986 | Yamamuro et al. |
| 4,592,383 A | 6/1986 | Rikuta |
| 4,595,338 A | 6/1986 | Kolm et al. |
| 4,598,338 A | 7/1986 | Van Devender et al. |
| 4,605,167 A | 8/1986 | Maehara |
| 4,626,730 A | 12/1986 | Hubbard, Jr. |
| 4,638,207 A | 1/1987 | Radice |
| 4,654,554 A | 3/1987 | Kishi |
| 4,668,449 A | 5/1987 | Soni et al. |
| 4,678,955 A | 7/1987 | Toda |
| 4,686,440 A | 8/1987 | Hatamura et al. |
| 4,689,614 A | 8/1987 | Strachan |
| 4,704,556 A | 11/1987 | Kay |
| 4,715,396 A | 12/1987 | Fox |
| 4,733,121 A | 3/1988 | Hebert |
| 4,748,366 A | 5/1988 | Taylor |
| 4,762,733 A | 8/1988 | Thiel et al. |
| 4,783,888 A | 11/1988 | Fujii et al. |
| 4,784,479 A | 11/1988 | Ikemori |
| 4,785,837 A | 11/1988 | Hansen et al. |
| 4,786,837 A | 11/1988 | Kalnin et al. |
| 4,787,411 A | 11/1988 | Moldenhauer |
| 4,793,588 A | 12/1988 | Laverty, Jr. |
| 4,803,671 A | 2/1989 | Rochling et al. |
| 4,814,661 A | 3/1989 | Ratzlaff et al. |
| 4,820,236 A | 4/1989 | Berliner et al. |
| 4,824,107 A | 4/1989 | French |
| 4,825,116 A | 4/1989 | Itoh et al. |
| 4,833,659 A | 5/1989 | Geil et al. |
| 4,835,747 A | 5/1989 | Billet |
| 4,839,872 A | 6/1989 | Gragnolati et al. |
| 4,843,275 A | 6/1989 | Radice |
| 4,849,668 A | 7/1989 | Crawley et al. |
| 4,868,447 A | 9/1989 | Lee et al. |
| 4,869,282 A | 9/1989 | Sittler et al. |
| 4,870,868 A | 10/1989 | Gastgeb et al. |
| 4,877,957 A | 10/1989 | Okada et al. |
| 4,877,988 A | 10/1989 | McGinniss et al. |
| 4,879,698 A | 11/1989 | Langberg |
| 4,885,783 A | 12/1989 | Whitehead et al. |
| 4,885,830 A | 12/1989 | Ohtaka |
| 4,904,222 A | 2/1990 | Gastgeb et al. |
| 4,906,886 A | 3/1990 | Breimesser et al. |
| 4,911,057 A | 3/1990 | Fishman |
| 4,911,995 A | 3/1990 | Belanger et al. |
| 4,958,100 A | 9/1990 | Crawley et al. |
| 4,961,956 A | 10/1990 | Simopoulos et al. |
| 4,969,197 A | 11/1990 | Takaya |
| 4,971,287 A | 11/1990 | Shaw |
| 4,980,597 A | 12/1990 | Iwao |
| 4,989,951 A | 2/1991 | Miyano et al. |
| 5,024,872 A | 6/1991 | Wilson et al. |
| RE33,651 E | 7/1991 | Blonder et al. |
| 5,030,874 A | 7/1991 | Saito et al. |
| 5,048,791 A | 9/1991 | Ellison et al. |
| 5,065,067 A | 11/1991 | Todd et al. |
| 5,076,538 A | 12/1991 | Mohr et al. |
| 5,085,401 A | 2/1992 | Botting et al. |
| 5,090,246 A | 2/1992 | Colla et al. |
| 5,090,794 A | 2/1992 | Hatano et al. |
| 5,100,100 A | 3/1992 | Benson et al. |
| 5,119,840 A | 6/1992 | Shibata |
| 5,132,582 A | 7/1992 | Hayashi et al. |
| 5,142,510 A | 8/1992 | Rodda |
| 5,148,735 A | 9/1992 | Veletovac |
| 5,149,514 A | 9/1992 | Sanjurjo |
| 5,153,820 A | 10/1992 | MacFarlane et al. |
| 5,153,859 A | 10/1992 | Chatigny et al. |
| 5,156,885 A | 10/1992 | Budd |
| 5,170,089 A | 12/1992 | Fulton |
| 5,171,734 A | 12/1992 | Sanjurjo et al. |
| 5,172,024 A | 12/1992 | Broussoux et al. |
| 5,188,447 A | 2/1993 | Chiang et al. |
| 5,199,641 A | 4/1993 | Hohm et al. |
| 5,206,557 A | 4/1993 | Bobbio |
| 5,229,979 A | 7/1993 | Scheinbeim et al. |
| 5,232,196 A | 8/1993 | Hutchings et al. |

(56) References Cited

U.S. PATENT DOCUMENTS

| | | |
|---|---|---|
| 5,240,004 A | 8/1993 | Walinsky et al. |
| 5,244,707 A | 9/1993 | Shores |
| 5,250,784 A | 10/1993 | Muller et al. |
| 5,254,296 A | 10/1993 | Perlman |
| 5,258,201 A | 11/1993 | Munn et al. |
| 5,281,885 A | 1/1994 | Watanabe et al. |
| 5,288,551 A | 2/1994 | Sato et al. |
| 5,291,335 A | 3/1994 | Ogino |
| 5,302,318 A | 4/1994 | Dutta et al. |
| 5,305,178 A | 4/1994 | Binder et al. |
| 5,321,332 A | 6/1994 | Toda |
| 5,350,966 A | 9/1994 | Culp |
| 5,352,574 A | 10/1994 | Guiseppi-Elie |
| 5,356,500 A | 10/1994 | Scheinbeim et al. |
| 5,361,240 A | 11/1994 | Pearce |
| 5,368,704 A | 11/1994 | Madou et al. |
| 5,369,995 A | 12/1994 | Scheinbeim et al. |
| 5,377,258 A | 12/1994 | Bro |
| 5,380,396 A | 1/1995 | Shikida et al. |
| 5,410,210 A | 4/1995 | Sato et al. |
| 5,417,235 A | 5/1995 | Wise et al. |
| 5,424,596 A | 6/1995 | Mendenhall et al. |
| 5,428,523 A | 6/1995 | McDonnal |
| 5,430,565 A | 7/1995 | Yamanouchi et al. |
| 5,438,553 A | 8/1995 | Wilson et al. |
| 5,440,194 A | 8/1995 | Beurrier |
| 5,452,878 A | 9/1995 | Gravesen et al. |
| 5,481,152 A | 1/1996 | Buschulte |
| 5,488,872 A | 2/1996 | McCormick |
| 5,493,372 A | 2/1996 | Mashtare et al. |
| 5,495,137 A | 2/1996 | Park et al. |
| 5,499,127 A | 3/1996 | Tsubota et al. |
| 5,500,635 A | 3/1996 | Mott |
| 5,504,388 A | 4/1996 | Kimura et al. |
| 5,509,888 A | 4/1996 | Miller |
| 5,515,341 A | 5/1996 | Toda et al. |
| 5,548,177 A | 8/1996 | Carroll |
| 5,559,387 A | 9/1996 | Beurrier |
| 5,563,466 A | 10/1996 | Rennex et al. |
| 5,571,148 A | 11/1996 | Loeb et al. |
| 5,578,889 A | 11/1996 | Epstein |
| 5,589,725 A | 12/1996 | Haertling |
| 5,591,986 A | 1/1997 | Niigaki et al. |
| 5,593,462 A | 1/1997 | Gueguen et al. |
| 5,632,841 A | 5/1997 | Hellbaum et al. |
| 5,636,072 A | 6/1997 | Shibata et al. |
| 5,636,100 A | 6/1997 | Zheng et al. |
| 5,642,015 A | 6/1997 | Whitehead et al. |
| 5,647,245 A | 7/1997 | Takei |
| 5,668,703 A | 9/1997 | Rossi et al. |
| 5,678,571 A | 10/1997 | Brown |
| 5,682,075 A | 10/1997 | Bolleman et al. |
| 5,684,637 A | 11/1997 | Floyd |
| 5,696,663 A | 12/1997 | Unami et al. |
| 5,703,295 A | 12/1997 | Ishida et al. |
| 5,717,563 A | 2/1998 | MacDougall et al. |
| 5,722,418 A | 3/1998 | Bro |
| 5,744,908 A | 4/1998 | Kyushima |
| 5,751,090 A | 5/1998 | Henderson |
| 5,755,909 A | 5/1998 | Gailus |
| 5,761,782 A | 6/1998 | Sager |
| 5,766,934 A | 6/1998 | Guiseppi-Elie |
| 5,777,540 A | 7/1998 | Dedert et al. |
| 5,788,468 A | 8/1998 | Dewa et al. |
| 5,800,421 A | 9/1998 | Lemelson |
| 5,801,475 A | 9/1998 | Kimura |
| 5,814,921 A | 9/1998 | Carroll |
| 5,828,157 A | 10/1998 | Miki et al. |
| 5,831,371 A | 11/1998 | Bishop |
| 5,835,453 A | 11/1998 | Wynne et al. |
| 5,847,690 A | 12/1998 | Boie et al. |
| 5,857,694 A | 1/1999 | Lazarus et al. |
| 5,876,675 A | 3/1999 | Kennedy |
| 5,883,466 A | 3/1999 | Suyama et al. |
| 5,889,354 A | 3/1999 | Sager |
| 5,892,314 A | 4/1999 | Sager et al. |
| 5,896,287 A | 4/1999 | Mihara et al. |
| 5,897,097 A | 4/1999 | Biegelsen et al. |
| 5,900,572 A | 5/1999 | Aeroe |
| 5,902,836 A | 5/1999 | Bennett et al. |
| 5,910,107 A | 6/1999 | Iliff |
| 5,912,499 A | 6/1999 | Diem et al. |
| 5,913,310 A | 6/1999 | Brown |
| 5,914,901 A | 6/1999 | Pascucci |
| 5,915,377 A | 6/1999 | Coffee |
| 5,918,502 A | 7/1999 | Bishop |
| 5,928,262 A | 7/1999 | Harber |
| 5,928,547 A | 7/1999 | Shea et al. |
| 5,933,170 A | 8/1999 | Takeuchi et al. |
| 5,971,355 A | 10/1999 | Biegelsen et al. |
| 5,977,685 A | 11/1999 | Kurita et al. |
| 5,984,760 A | 11/1999 | Marine |
| 5,988,902 A | 11/1999 | Holehan |
| 6,012,961 A | 1/2000 | Sharpe, III et al. |
| 6,037,707 A | 3/2000 | Gailus et al. |
| 6,040,356 A | 3/2000 | Kanki et al. |
| 6,048,276 A | 4/2000 | Vandergrift |
| 6,048,622 A | 4/2000 | Hagood, IV et al. |
| 6,055,859 A | 5/2000 | Kozuka et al. |
| 6,059,546 A | 5/2000 | Brenan et al. |
| 6,060,811 A | 5/2000 | Fox et al. |
| 6,069,420 A | 5/2000 | Mizzi et al. |
| 6,074,178 A | 6/2000 | Bishop et al. |
| 6,075,504 A | 6/2000 | Stoller |
| 6,078,126 A | 6/2000 | Rollins et al. |
| 6,084,321 A | 7/2000 | Hunter et al. |
| 6,089,701 A | 7/2000 | Hashizume et al. |
| 6,093,078 A | 7/2000 | Cook |
| 6,093,995 A | 7/2000 | Lazarus et al. |
| 6,094,988 A | 8/2000 | Aindow |
| 6,097,821 A | 8/2000 | Yokoyama et al. |
| 6,108,275 A | 8/2000 | Hughes et al. |
| 6,111,743 A | 8/2000 | Lavene |
| 6,117,396 A | 9/2000 | Demers |
| 6,130,510 A | 10/2000 | Kurihara et al. |
| 6,133,398 A | 10/2000 | Bhat et al. |
| 6,140,131 A | 10/2000 | Sunakawa et al. |
| 6,140,740 A | 10/2000 | Porat et al. |
| 6,140,746 A | 10/2000 | Miyashita et al. |
| 6,148,842 A | 11/2000 | Kappel et al. |
| 6,156,842 A | 12/2000 | Hoenig et al. |
| 6,157,528 A | 12/2000 | Anthony |
| 6,161,966 A | 12/2000 | Chang et al. |
| 6,165,126 A | 12/2000 | Merzenich et al. |
| 6,168,133 B1 | 1/2001 | Heinz et al. |
| 6,181,351 B1 | 1/2001 | Merrill et al. |
| 6,184,044 B1 | 2/2001 | Sone et al. |
| 6,184,608 B1 | 2/2001 | Cabuz et al. |
| 6,184,609 B1 | 2/2001 | Johansson et al. |
| 6,184,844 B1 | 2/2001 | Filipovic et al. |
| 6,190,805 B1 | 2/2001 | Takeuchi et al. |
| 6,194,815 B1 | 2/2001 | Carroll |
| 6,196,935 B1 | 3/2001 | Spangler et al. |
| 6,198,203 B1 | 3/2001 | Hotomi |
| 6,198,204 B1 | 3/2001 | Pottenger |
| 6,201,398 B1 | 3/2001 | Takada |
| 6,210,827 B1 | 4/2001 | Dopp et al. |
| 6,228,533 B1 | 5/2001 | Ohashi et al. |
| 6,232,702 B1 | 5/2001 | Newnham et al. |
| 6,239,535 B1 | 5/2001 | Toda et al. |
| 6,239,536 B1 | 5/2001 | Lakin |
| 6,240,814 B1 | 6/2001 | Boyd et al. |
| 6,248,262 B1 | 6/2001 | Kubotera et al. |
| 6,249,076 B1 | 6/2001 | Madden et al. |
| 6,252,221 B1 | 6/2001 | Kaneko et al. |
| 6,252,334 B1 | 6/2001 | Nye et al. |
| 6,252,336 B1 | 6/2001 | Hall |
| 6,255,758 B1 | 7/2001 | Cabuz et al. |
| 6,262,516 B1 | 7/2001 | Fukuda et al. |
| 6,268,219 B1 | 7/2001 | McBride et al. |
| 6,282,074 B1 | 8/2001 | Anthony |
| 6,284,435 B1 | 9/2001 | Cao |
| 6,286,961 B1 | 9/2001 | Ogawa |
| 6,291,155 B1 | 9/2001 | Raguse et al. |

(56) References Cited

U.S. PATENT DOCUMENTS

| | | | |
|---|---|---|---|
| 6,291,928 | B1 | 9/2001 | Lazarus et al. |
| 6,294,859 | B1 | 9/2001 | Jaenker |
| 6,297,579 | B1 | 10/2001 | Martin et al. |
| 6,311,950 | B1 | 11/2001 | Kappel et al. |
| 6,316,084 | B1 | 11/2001 | Claus et al. |
| 6,321,428 | B1 | 11/2001 | Toda et al. |
| 6,330,463 | B1 | 12/2001 | Hedrich |
| 6,333,595 | B1 | 12/2001 | Horikawa et al. |
| 6,334,673 | B1 | 1/2002 | Kitahara et al. |
| 6,336,367 | B1 | 1/2002 | Raeisaenen |
| 6,336,880 | B1 | 1/2002 | Agner |
| 6,339,527 | B1 | 1/2002 | Farooq et al. |
| 6,343,129 | B1 | 1/2002 | Pelrine et al. |
| 6,345,840 | B1 | 2/2002 | Meyer et al. |
| 6,349,141 | B1 | 2/2002 | Corsaro |
| 6,355,185 | B1 | 3/2002 | Kubota |
| 6,358,021 | B1 | 3/2002 | Cabuz |
| 6,359,370 | B1 | 3/2002 | Chang |
| 6,366,193 | B2 | 4/2002 | Duggal et al. |
| 6,369,954 | B1 | 4/2002 | Berge et al. |
| 6,375,857 | B1 | 4/2002 | Ng et al. |
| 6,376,971 | B1 | 4/2002 | Pelrine et al. |
| 6,377,383 | B1 | 4/2002 | Whitehead et al. |
| 6,379,393 | B1 | 4/2002 | Mavroidis et al. |
| 6,379,809 | B1 | 4/2002 | Simpson et al. |
| 6,385,021 | B1 | 5/2002 | Takeda et al. |
| 6,385,429 | B1 | 5/2002 | Weber et al. |
| 6,388,043 | B1 | 5/2002 | Langer et al. |
| 6,388,553 | B1 | 5/2002 | Shea et al. |
| 6,388,856 | B1 | 5/2002 | Anthony |
| 6,400,065 | B1 | 6/2002 | Toda et al. |
| 6,404,107 | B1 | 6/2002 | Lazarus et al. |
| 6,411,009 | B2 | 6/2002 | Jaenker |
| 6,411,013 | B1 | 6/2002 | Horning |
| 6,424,079 | B1 | 7/2002 | Carroll |
| 6,429,573 | B2 | 8/2002 | Koopmann et al. |
| 6,429,576 | B1 | 8/2002 | Simes |
| 6,433,689 | B1 | 8/2002 | Hovind et al. |
| 6,434,245 | B1 | 8/2002 | Zimmermann |
| 6,435,840 | B1 | 8/2002 | Sharma et al. |
| 6,436,531 | B1 | 8/2002 | Kollaja et al. |
| 6,437,489 | B1 | 8/2002 | Shinke et al. |
| 6,457,697 | B1 | 10/2002 | Kolze |
| 6,459,088 | B1 | 10/2002 | Yasuda et al. |
| 6,471,185 | B2 | 10/2002 | Lewin et al. |
| 6,475,931 | B2 | 11/2002 | Bower et al. |
| 6,486,589 | B1 | 11/2002 | Dujari et al. |
| 6,492,762 | B1 | 12/2002 | Pant et al. |
| 6,495,945 | B2 | 12/2002 | Yamaguchi et al. |
| 6,499,509 | B2 | 12/2002 | Berger et al. |
| 6,502,803 | B1 | 1/2003 | Mattes |
| 6,504,286 | B1 | 1/2003 | Porat et al. |
| 6,509,802 | B2 | 1/2003 | Kasperkovitz |
| 6,514,237 | B1 | 2/2003 | Maseda |
| 6,522,516 | B2 | 2/2003 | Anthony |
| 6,523,560 | B1 | 2/2003 | Williams et al. |
| 6,528,925 | B1 | 3/2003 | Takeuchi et al. |
| 6,528,928 | B1 | 3/2003 | Burns et al. |
| 6,530,266 | B1 | 3/2003 | Adderton et al. |
| 6,532,145 | B1 | 3/2003 | Carlen et al. |
| 6,540,893 | B1 * | 4/2003 | Wakida ................ G01N 27/414 204/416 |
| 6,543,110 | B1 | 4/2003 | Pelrine et al. |
| 6,545,384 | B1 | 4/2003 | Pelrine et al. |
| 6,562,513 | B1 | 5/2003 | Takeuchi et al. |
| 6,583,533 | B2 | 6/2003 | Pelrine et al. |
| 6,586,859 | B2 | 7/2003 | Kornbluh et al. |
| 6,590,267 | B1 | 7/2003 | Goodwin-Johansson et al. |
| 6,593,155 | B2 | 7/2003 | Mohler et al. |
| 6,613,816 | B2 | 9/2003 | Mahdi et al. |
| 6,617,759 | B1 | 9/2003 | Zumeris et al. |
| 6,617,765 | B1 | 9/2003 | Lagier et al. |
| 6,619,799 | B1 | 9/2003 | Blum et al. |
| 6,628,040 | B2 | 9/2003 | Pelrine et al. |
| 6,631,068 | B1 | 10/2003 | Lobo |
| 6,637,276 | B2 | 10/2003 | Adderton et al. |
| 6,640,402 | B1 | 11/2003 | Vooren et al. |
| 6,644,027 | B1 | 11/2003 | Kelly |
| 6,646,077 | B1 | 11/2003 | Lyons |
| 6,650,455 | B2 | 11/2003 | Miles |
| 6,652,938 | B1 | 11/2003 | Nishikawa et al. |
| 6,654,004 | B2 | 11/2003 | Hoggarth |
| 6,664,718 | B2 | 12/2003 | Pelrine et al. |
| 6,668,109 | B2 | 12/2003 | Nahum et al. |
| 6,673,533 | B1 | 1/2004 | Wohlstadter et al. |
| 6,680,825 | B1 | 1/2004 | Murphy et al. |
| 6,682,500 | B2 | 1/2004 | Soltanpour et al. |
| 6,690,101 | B2 | 2/2004 | Magnussen et al. |
| 6,700,314 | B2 | 3/2004 | Cuhat et al. |
| 6,701,296 | B1 | 3/2004 | Kramer et al. |
| 6,707,236 | B2 | 3/2004 | Pelrine et al. |
| 6,720,710 | B1 | 4/2004 | Wenzel et al. |
| 6,733,130 | B2 | 5/2004 | Blum et al. |
| 6,743,273 | B2 | 6/2004 | Chung et al. |
| 6,762,050 | B2 | 7/2004 | Fukushima et al. |
| 6,768,246 | B2 | 7/2004 | Pelrine et al. |
| 6,781,284 | B1 | 8/2004 | Pelrine et al. |
| 6,784,227 | B2 | 8/2004 | Simon et al. |
| 6,791,205 | B2 | 9/2004 | Woodbridge |
| 6,796,639 | B2 | 9/2004 | Sugahara |
| 6,800,155 | B2 | 10/2004 | Senecal et al. |
| 6,804,068 | B2 | 10/2004 | Sasaki et al. |
| 6,806,621 | B2 | 10/2004 | Heim et al. |
| 6,806,806 | B2 | 10/2004 | Anthony |
| 6,806,808 | B1 | 10/2004 | Watters et al. |
| 6,809,462 | B2 | 10/2004 | Pelrine et al. |
| 6,809,928 | B2 | 10/2004 | Gwin et al. |
| 6,812,624 | B1 | 11/2004 | Pei et al. |
| 6,824,689 | B2 | 11/2004 | Wang et al. |
| 6,847,153 | B1 | 1/2005 | Balizer |
| 6,847,155 | B2 | 1/2005 | Schwartz et al. |
| 6,856,305 | B2 | 2/2005 | Nagano |
| 6,864,592 | B1 | 3/2005 | Kelly |
| 6,866,242 | B2 | 3/2005 | Hirota |
| 6,867,533 | B1 | 3/2005 | Su et al. |
| 6,869,275 | B2 | 3/2005 | Dante et al. |
| 6,876,125 | B2 | 4/2005 | Basheer et al. |
| 6,876,135 | B2 | 4/2005 | Pelrine et al. |
| 6,879,318 | B1 | 4/2005 | Chan et al. |
| 6,882,086 | B2 | 4/2005 | Kornbluh et al. |
| 6,891,317 | B2 | 5/2005 | Pei et al. |
| 6,902,048 | B1 | 6/2005 | Chung |
| 6,911,764 | B2 | 6/2005 | Pelrine et al. |
| 6,935,287 | B2 | 8/2005 | Shinogle |
| 6,938,945 | B2 | 9/2005 | Wald et al. |
| 6,940,211 | B2 | 9/2005 | Pelrine et al. |
| 6,940,212 | B2 | 9/2005 | Mueller |
| 6,940,221 | B2 | 9/2005 | Matsukiyo et al. |
| 6,944,931 | B2 | 9/2005 | Shcheglov et al. |
| 6,952,313 | B2 | 10/2005 | Schrader |
| 6,967,430 | B2 | 11/2005 | Johansson |
| 6,994,314 | B2 | 2/2006 | Garnier et al. |
| 6,997,870 | B2 | 2/2006 | Couvillon, Jr. |
| 7,008,838 | B1 | 3/2006 | Hosking et al. |
| 7,011,378 | B2 | 3/2006 | Maluf et al. |
| 7,011,760 | B2 | 3/2006 | Wang et al. |
| 7,029,056 | B2 | 4/2006 | Browne et al. |
| 7,034,432 | B1 | 4/2006 | Pelrine et al. |
| 7,037,270 | B2 | 5/2006 | Seward |
| 7,038,357 | B2 | 5/2006 | Goldenberg et al. |
| 7,049,732 | B2 | 5/2006 | Pei et al. |
| 7,052,594 | B2 | 5/2006 | Pelrine et al. |
| 7,062,055 | B2 | 6/2006 | Pelrine et al. |
| 7,063,268 | B2 | 6/2006 | Chrysler et al. |
| 7,063,377 | B2 | 6/2006 | Brei et al. |
| 7,064,472 | B2 | 6/2006 | Pelrine et al. |
| 7,071,596 | B2 | 7/2006 | Krill |
| 7,075,162 | B2 | 7/2006 | Unger |
| 7,075,213 | B2 | 7/2006 | Krill |
| 7,092,238 | B2 | 8/2006 | Saito et al. |
| 7,099,141 | B1 | 8/2006 | Kaufman et al. |
| 7,104,146 | B2 | 9/2006 | Benslimane et al. |
| 7,109,643 | B2 | 9/2006 | Hirai et al. |
| 7,113,318 | B2 | 9/2006 | Onuki et al. |

(56) References Cited

U.S. PATENT DOCUMENTS

| | | | |
|---|---|---|---|
| 7,113,848 | B2 | 9/2006 | Hanson |
| 7,115,092 | B2 | 10/2006 | Park et al. |
| 7,140,180 | B2 | 11/2006 | Gerber et al. |
| 7,141,888 | B2 | 11/2006 | Sabol et al. |
| 7,142,368 | B2 | 11/2006 | Kim et al. |
| 7,142,369 | B2 | 11/2006 | Wu et al. |
| 7,144,616 | B1 | 12/2006 | Unger et al. |
| 7,148,789 | B2 | 12/2006 | Sadler et al. |
| 7,164,212 | B2 | 1/2007 | Leijon et al. |
| 7,166,952 | B2 | 1/2007 | Topliss et al. |
| 7,166,953 | B2 | 1/2007 | Heim et al. |
| 7,170,665 | B2 | 1/2007 | Kaneko et al. |
| 7,190,016 | B2 | 3/2007 | Cahalen et al. |
| 7,193,350 | B1 | 3/2007 | Blackburn et al. |
| 7,195,393 | B2 | 3/2007 | Potter |
| 7,195,950 | B2 | 3/2007 | Taussig |
| 7,196,688 | B2 | 3/2007 | Schena |
| 7,199,302 | B2 | 4/2007 | Raisanen |
| 7,199,501 | B2 | 4/2007 | Pei et al. |
| 7,205,704 | B2 | 4/2007 | Audren et al. |
| 7,205,978 | B2 | 4/2007 | Poupyrev et al. |
| 7,209,280 | B2 | 4/2007 | Goossens |
| 7,211,937 | B2 | 5/2007 | Kornbluh et al. |
| 7,220,785 | B2 | 5/2007 | Saito |
| 7,224,106 | B2 | 5/2007 | Pei et al. |
| 7,233,097 | B2 | 6/2007 | Rosenthal et al. |
| 7,235,152 | B2 | 6/2007 | Bell et al. |
| 7,237,524 | B2 | 7/2007 | Pelrine et al. |
| 7,242,106 | B2 | 7/2007 | Kelly |
| 7,242,141 | B2 | 7/2007 | Pschenitzka et al. |
| 7,245,440 | B2 | 7/2007 | Peseux |
| 7,256,943 | B1 | 8/2007 | Kobrin et al. |
| 7,259,495 | B2 | 8/2007 | Asai et al. |
| 7,259,503 | B2 | 8/2007 | Pei et al. |
| 7,276,090 | B2 | 10/2007 | Shahinpoor et al. |
| 7,291,512 | B2 | 11/2007 | Unger |
| 7,298,054 | B2 | 11/2007 | Hirsch |
| 7,298,559 | B2 | 11/2007 | Kato et al. |
| 7,298,603 | B2 | 11/2007 | Mizuno et al. |
| 7,301,261 | B2 | 11/2007 | Ifuku et al. |
| 7,310,874 | B2 | 12/2007 | Higuchi et al. |
| 7,312,917 | B2 | 12/2007 | Jacob |
| 7,316,794 | B2 | 1/2008 | O'Brien |
| 7,320,457 | B2 | 1/2008 | Heim et al. |
| 7,321,185 | B2 | 1/2008 | Schultz |
| 7,323,790 | B2 | 1/2008 | Taylor et al. |
| 7,332,688 | B2 | 2/2008 | Browne et al. |
| 7,339,285 | B2 | 3/2008 | Negron Crespo |
| 7,339,572 | B2 | 3/2008 | Schena |
| 7,342,573 | B2 | 3/2008 | Ryynanen |
| 7,344,763 | B2 | 3/2008 | Kokeguchi et al. |
| 7,355,293 | B2 | 4/2008 | Bernhoff et al. |
| 7,359,124 | B1 | 4/2008 | Fang et al. |
| 7,362,031 | B2 | 4/2008 | Maita et al. |
| 7,362,032 | B2 | 4/2008 | Pelrine et al. |
| 7,362,889 | B2 | 4/2008 | Dubowsky et al. |
| 7,368,862 | B2 | 5/2008 | Pelrine et al. |
| 7,371,596 | B2 | 5/2008 | Warner, Jr. et al. |
| 7,373,454 | B1 | 5/2008 | Noe |
| 7,378,783 | B2 | 5/2008 | Pelrine et al. |
| 7,392,876 | B2 | 7/2008 | Browne et al. |
| 7,394,182 | B2 | 7/2008 | Pelrine et al. |
| 7,394,282 | B2 | 7/2008 | Sinha et al. |
| 7,394,641 | B2 | 7/2008 | Won et al. |
| 7,397,166 | B1 | 7/2008 | Morgan et al. |
| 7,401,846 | B2 | 7/2008 | Browne et al. |
| 7,411,332 | B2 | 8/2008 | Kornbluh et al. |
| 7,426,340 | B2 | 9/2008 | Seo |
| 7,429,074 | B2 | 9/2008 | McKnight et al. |
| 7,429,495 | B2 | 9/2008 | Wan |
| 7,436,099 | B2 | 10/2008 | Pei et al. |
| 7,436,646 | B2 | 10/2008 | Delince et al. |
| 7,442,421 | B2 | 10/2008 | Li et al. |
| 7,442,760 | B2 | 10/2008 | Roberts et al. |
| 7,444,072 | B2 | 10/2008 | Seo |
| 7,446,926 | B2 | 11/2008 | Sampsell |
| 7,449,821 | B2 | 11/2008 | Dausch |
| 7,454,820 | B2 | 11/2008 | Nakamura |
| 7,456,549 | B2 | 11/2008 | Heim et al. |
| 7,468,575 | B2 | 12/2008 | Pelrine et al. |
| 7,481,120 | B2 | 1/2009 | Gravesen et al. |
| 7,482,745 | B2 | 1/2009 | Shirogane et al. |
| 7,492,076 | B2 | 2/2009 | Heim et al. |
| 7,498,729 | B2 | 3/2009 | Ogino |
| 7,499,223 | B2 | 3/2009 | Berge et al. |
| 7,511,706 | B2 | 3/2009 | Schena |
| 7,513,624 | B2 | 4/2009 | Yavid et al. |
| 7,515,350 | B2 | 4/2009 | Berge et al. |
| 7,518,284 | B2 | 4/2009 | Benslimane et al. |
| 7,521,840 | B2 | 4/2009 | Heim |
| 7,521,847 | B2 | 4/2009 | Heim |
| 7,537,197 | B2 | 5/2009 | Heim et al. |
| 7,548,015 | B2 | 6/2009 | Benslimane et al. |
| 7,548,232 | B2 | 6/2009 | Shahoian et al. |
| 7,567,681 | B2 | 7/2009 | Pelrine et al. |
| 7,573,064 | B2 | 8/2009 | Benslimane et al. |
| 7,585,122 | B2 | 9/2009 | Eromaki et al. |
| 7,586,242 | B2 | 9/2009 | Yokoyama et al. |
| 7,595,580 | B2 | 9/2009 | Heim |
| 7,608,989 | B2 | 10/2009 | Heydt et al. |
| 7,626,319 | B2 | 12/2009 | Heim |
| 7,646,544 | B2 | 1/2010 | Batchko et al. |
| 7,648,118 | B2 | 1/2010 | Ukpai et al. |
| 7,659,918 | B2 | 2/2010 | Turner |
| 7,679,267 | B2 | 3/2010 | Heim |
| 7,679,839 | B2 | 3/2010 | Polyakov et al. |
| 7,690,622 | B2 | 4/2010 | Ito et al. |
| 7,702,227 | B2 | 4/2010 | Ito et al. |
| 7,703,740 | B1 | 4/2010 | Franklin |
| 7,703,742 | B2 | 4/2010 | Heim et al. |
| 7,703,839 | B2 | 4/2010 | McKnight et al. |
| 7,705,521 | B2 | 4/2010 | Pelrine et al. |
| 7,714,701 | B2 | 5/2010 | Altan et al. |
| 7,732,999 | B2 | 6/2010 | Clausen et al. |
| 7,733,575 | B2 | 6/2010 | Heim et al. |
| 7,745,374 | B2 | 6/2010 | Tanaka et al. |
| 7,750,532 | B2 | 7/2010 | Heim |
| 7,750,617 | B2 | 7/2010 | Omi |
| 7,761,981 | B2 | 7/2010 | Rosenthal et al. |
| 7,772,745 | B2 | 8/2010 | Kawakubo et al. |
| 7,785,656 | B2 | 8/2010 | Pei et al. |
| 7,787,646 | B2 | 8/2010 | Pelrine et al. |
| 7,813,047 | B2 | 10/2010 | Wang et al. |
| 7,824,580 | B2 | 11/2010 | Boll et al. |
| 7,886,993 | B2 | 2/2011 | Bachmaier et al. |
| 7,893,965 | B2 | 2/2011 | Heim et al. |
| 7,898,159 | B2 | 3/2011 | Heydt et al. |
| 7,911,115 | B2 | 3/2011 | Pelrine et al. |
| 7,911,761 | B2 | 3/2011 | Biggs et al. |
| 7,915,789 | B2 | 3/2011 | Smith |
| 7,915,790 | B2 | 3/2011 | Heim et al. |
| 7,921,541 | B2 | 4/2011 | Pei et al. |
| 7,923,064 | B2 | 4/2011 | Pelrine et al. |
| 7,923,902 | B2 | 4/2011 | Heim |
| 7,923,982 | B2 | 4/2011 | Sumita |
| 7,940,476 | B2 | 5/2011 | Polyakov et al. |
| 7,952,261 | B2 | 5/2011 | Lipton et al. |
| 7,971,850 | B2 | 7/2011 | Heim et al. |
| 7,980,671 | B2 | 7/2011 | Nystrom et al. |
| 7,986,466 | B2 | 7/2011 | Lee et al. |
| 7,990,022 | B2 | 8/2011 | Heim |
| 7,997,260 | B2 | 8/2011 | Kaakkola et al. |
| 8,004,339 | B2 | 8/2011 | Barrow |
| 8,026,023 | B2 | 9/2011 | Hamada |
| 8,033,324 | B2 | 10/2011 | Mukasa et al. |
| 8,042,264 | B2 | 10/2011 | Rosenthal et al. |
| 8,049,333 | B2 | 11/2011 | Alden et al. |
| 8,050,601 | B2 | 11/2011 | Lin et al. |
| 8,054,566 | B2 | 11/2011 | Heim et al. |
| 8,056,618 | B2 | 11/2011 | Wagner et al. |
| 8,058,861 | B2 | 11/2011 | Pelrine et al. |
| 8,072,121 | B2 | 12/2011 | Heim et al. |
| 8,074,939 | B2 | 12/2011 | Hyde et al. |
| 8,093,783 | B2 | 1/2012 | Rosenthal et al. |

(56) References Cited

U.S. PATENT DOCUMENTS

| | | |
|---|---|---|
| 8,127,437 B2 | 3/2012 | Lipton et al. |
| 8,133,932 B2 | 3/2012 | Kijlstra et al. |
| 8,164,835 B2 | 4/2012 | Heim et al. |
| 8,172,998 B2 | 5/2012 | Bennett et al. |
| 8,183,739 B2 | 5/2012 | Heim |
| 8,211,054 B2 | 7/2012 | Dewey |
| 8,221,944 B2 | 7/2012 | Shirasaki et al. |
| 8,222,799 B2 | 7/2012 | Polyakov et al. |
| 8,237,324 B2 | 8/2012 | Pei et al. |
| 8,248,750 B2 | 8/2012 | Biggs et al. |
| 8,258,238 B2 | 9/2012 | Boersma |
| 8,283,839 B2 | 10/2012 | Heim |
| 8,294,600 B2 | 10/2012 | Peterson et al. |
| 8,310,444 B2 | 11/2012 | Peterson et al. |
| 8,316,526 B2 | 11/2012 | Pei et al. |
| 8,319,403 B2 | 11/2012 | Lipton et al. |
| 8,419,822 B2 | 4/2013 | Li |
| 8,421,316 B2 | 4/2013 | Tryson et al. |
| 8,508,109 B2 | 8/2013 | Pelrine et al. |
| 8,545,987 B2 | 10/2013 | Strader et al. |
| 8,585,007 B2 | 11/2013 | Schapeler et al. |
| 8,594,839 B2 | 11/2013 | Hanson |
| 8,679,575 B2 | 3/2014 | Biggs et al. |
| 8,679,621 B2 | 3/2014 | Blaiszik et al. |
| 8,773,373 B2 | 7/2014 | Sato et al. |
| 8,779,650 B2 | 7/2014 | Jenninger et al. |
| 8,842,355 B2 | 9/2014 | Lipton et al. |
| 8,975,888 B2 | 3/2015 | Pelrine et al. |
| 8,981,621 B2 | 3/2015 | Pelrine et al. |
| RE45,464 E | 4/2015 | Kornbluh et al. |
| 9,195,058 B2 | 11/2015 | Zarrabi et al. |
| 9,231,186 B2 | 1/2016 | Büsgen |
| 2001/0007449 A1 | 7/2001 | Kobachi et al. |
| 2002/0083858 A1 | 7/2002 | MacDiarmid et al. |
| 2003/0168936 A1 | 9/2003 | Everingham et al. |
| 2004/0014860 A1 | 1/2004 | Meier et al. |
| 2004/0035472 A1 | 2/2004 | Teltscher et al. |
| 2004/0046739 A1 | 3/2004 | Gettemy |
| 2004/0124738 A1 | 7/2004 | Pelrine et al. |
| 2005/0002113 A1 | 1/2005 | Berge |
| 2005/0046312 A1 | 3/2005 | Miyoshi |
| 2005/0085693 A1 | 4/2005 | Belson et al. |
| 2005/0113892 A1 | 5/2005 | Sproul |
| 2005/0140922 A1 | 6/2005 | Bekerman et al. |
| 2005/0200984 A1 | 9/2005 | Browne et al. |
| 2006/0057377 A1 | 3/2006 | Harrison et al. |
| 2006/0079619 A1 | 4/2006 | Wang et al. |
| 2006/0108416 A1 | 5/2006 | Hirai |
| 2006/0122954 A1 | 6/2006 | Podlasek et al. |
| 2006/0138371 A1 | 6/2006 | Garnier |
| 2006/0163725 A1 | 7/2006 | Haba et al. |
| 2006/0197741 A1 | 9/2006 | Biggadike |
| 2006/0238069 A1 | 10/2006 | Maruyama et al. |
| 2006/0258912 A1 | 11/2006 | Belson et al. |
| 2007/0080435 A1 | 4/2007 | Lin |
| 2007/0122132 A1 | 5/2007 | Misawa et al. |
| 2007/0152982 A1 | 7/2007 | Kim et al. |
| 2007/0170910 A1 | 7/2007 | Chang et al. |
| 2007/0173602 A1 | 7/2007 | Brinkman et al. |
| 2007/0189667 A1 | 8/2007 | Wakita et al. |
| 2007/0200457 A1 | 8/2007 | Heim et al. |
| 2007/0219285 A1 | 9/2007 | Kropp et al. |
| 2007/0229795 A1* | 10/2007 | Zhang .................. G03F 7/2041 355/77 |
| 2007/0230222 A1 | 10/2007 | Drabing et al. |
| 2008/0043318 A1 | 2/2008 | Whitesides et al. |
| 2008/0062589 A1 | 3/2008 | Drabing |
| 2008/0143696 A1 | 6/2008 | Goulthorpe |
| 2008/0152921 A1 | 6/2008 | Kropp |
| 2008/0191832 A1 | 8/2008 | Tsai |
| 2008/0303782 A1 | 12/2008 | Grant et al. |
| 2009/0028491 A1 | 1/2009 | Fillion et al. |
| 2009/0050829 A1 | 2/2009 | Haynes et al. |
| 2009/0104448 A1 | 4/2009 | Thompson et al. |
| 2009/0184606 A1 | 7/2009 | Rosenthal et al. |
| 2009/0250021 A1 | 10/2009 | Zarrabi et al. |
| 2009/0297829 A1 | 12/2009 | Pyles et al. |
| 2010/0006827 A1 | 1/2010 | Buckley |
| 2010/0033196 A1* | 2/2010 | Hayakawa ............... G01B 7/22 324/686 |
| 2010/0236843 A1 | 9/2010 | Englund |
| 2010/0265031 A1 | 10/2010 | Yen |
| 2011/0021917 A1 | 1/2011 | Morita |
| 2011/0128239 A1 | 6/2011 | Polyakov et al. |
| 2011/0155307 A1 | 6/2011 | Pelrine et al. |
| 2011/0256383 A1 | 10/2011 | Cochet et al. |
| 2011/0285247 A1 | 11/2011 | Lipton et al. |
| 2012/0126959 A1 | 5/2012 | Zarrabi et al. |
| 2014/0014715 A1 | 1/2014 | Moran et al. |
| 2014/0176753 A1 | 6/2014 | Hillis et al. |
| 2014/0290834 A1 | 10/2014 | Egron et al. |
| 2014/0319971 A1 | 10/2014 | Yoo et al. |
| 2014/0322522 A1 | 10/2014 | Yoo |
| 2014/0352879 A1 | 12/2014 | Yoo et al. |
| 2015/0009009 A1 | 1/2015 | Zarrabi et al. |
| 2015/0034237 A1 | 2/2015 | Biggs et al. |
| 2015/0043095 A1 | 2/2015 | Lipton et al. |
| 2015/0084483 A1 | 3/2015 | Yoo et al. |
| 2015/0096666 A1 | 4/2015 | Yoo et al. |
| 2015/0221851 A1 | 8/2015 | Biggs et al. |
| 2015/0221852 A1 | 8/2015 | Biggs et al. |
| 2015/0221861 A1 | 8/2015 | Biggs et al. |
| 2015/0231802 A1 | 8/2015 | Quan et al. |
| 2015/0270791 A1 | 9/2015 | Sutherland et al. |
| 2015/0319514 A1 | 11/2015 | Hitchcock et al. |
| 2016/0025429 A1 | 1/2016 | Muir et al. |

FOREIGN PATENT DOCUMENTS

| | | |
|---|---|---|
| CA | 2769441 A1 | 2/2011 |
| CN | 1447365 A | 10/2003 |
| DE | 2535833 A1 | 2/1977 |
| DE | 4408618 A1 | 9/1995 |
| DE | 19636909 C1 | 3/1998 |
| DE | 19952062 A1 | 5/2002 |
| DE | 10058096 A1 | 6/2002 |
| DE | 10161349 A1 | 7/2003 |
| DE | 10335019 A1 | 2/2005 |
| EP | 0196839 A2 | 10/1986 |
| EP | 0295907 A1 | 12/1988 |
| EP | 0154473 B1 | 5/1992 |
| EP | 0522882 A2 | 1/1993 |
| EP | 0833182 A2 | 4/1998 |
| EP | 0980103 A2 | 2/2000 |
| EP | 1050955 A1 | 11/2000 |
| EP | 1090835 A1 | 4/2001 |
| EP | 1323925 A2 | 7/2004 |
| EP | 1528609 A2 | 5/2005 |
| EP | 1698876 A2 | 9/2006 |
| EP | 1843406 A1 | 10/2007 |
| EP | 1976036 A2 | 10/2008 |
| EP | 2119747 B1 | 11/2009 |
| EP | 2511314 A1 | 10/2012 |
| FR | 2208461 A5 | 6/1974 |
| FR | 2745476 A1 | 9/1997 |
| GB | 2338513 A | 12/1999 |
| GB | 2470006 A | 11/2010 |
| JP | S 5181120 A | 7/1976 |
| JP | S 52120840 A | 10/1977 |
| JP | S 5445593 A | 4/1979 |
| JP | S 5542474 A | 3/1980 |
| JP | S 5565569 A | 5/1980 |
| JP | S 5661679 A | 5/1981 |
| JP | S 56101788 A | 8/1981 |
| JP | S 59126689 A | 7/1984 |
| JP | S 6199499 A | 5/1986 |
| JP | S 61239799 A | 10/1986 |
| JP | S 6397100 A | 4/1988 |
| JP | H 02162214 A | 6/1990 |
| JP | 02222019 A | 9/1990 |
| JP | 03173022 A | 7/1991 |
| JP | H 05244782 A | 9/1993 |
| JP | H 07111785 A | 4/1995 |
| JP | H 07240544 A | 9/1995 |

(56) References Cited

FOREIGN PATENT DOCUMENTS

| | | |
|---|---|---|
| JP | H 09275688 A | 10/1997 |
| JP | H 10137655 A | 5/1998 |
| JP | H 10207616 A | 8/1998 |
| JP | H 10321482 A | 12/1998 |
| JP | H 112764 A | 1/1999 |
| JP | 11134109 A | 5/1999 |
| JP | H 11133210 A | 5/1999 |
| JP | 2000-081504 A | 3/2000 |
| JP | 2000-331874 A | 11/2000 |
| JP | 2001-130774 A | 5/2001 |
| JP | 2001-136598 A | 5/2001 |
| JP | 2001-286162 A | 10/2001 |
| JP | 2001-291906 A | 10/2001 |
| JP | 2003-040041 A | 2/2003 |
| JP | 3501216 B2 | 3/2004 |
| JP | 2004-516966 A | 6/2004 |
| JP | 2004-205827 A | 7/2004 |
| JP | 2004-221742 A | 8/2004 |
| JP | 2004-296154 A | 10/2004 |
| JP | 2004-353279 A | 12/2004 |
| JP | 2005-001885 A | 1/2005 |
| JP | 2005-202707 A | 7/2005 |
| JP | 3709723 B2 | 8/2005 |
| JP | 2005-260236 A | 9/2005 |
| JP | 2006-048302 A | 2/2006 |
| JP | 2006-509052 A | 3/2006 |
| JP | 2006-178434 A | 7/2006 |
| JP | 2006-244490 A | 9/2006 |
| JP | 2007-206362 A | 8/2007 |
| JP | 2007-287670 A | 11/2007 |
| JP | 2008-262955 A | 10/2008 |
| JP | 2008-277729 A | 11/2008 |
| JP | 2009-077618 A | 4/2009 |
| JP | 2009-249313 A | 10/2009 |
| JP | 2010-273524 A | 12/2010 |
| JP | 5415442 B2 | 2/2014 |
| KR | 2004-0097921 A | 12/2004 |
| KR | 10-0607839 B1 | 8/2006 |
| KR | 10-0650190 B1 | 11/2006 |
| KR | 2008-0100757 A | 11/2008 |
| KR | 2010-0121801 A | 11/2010 |
| KR | 20110122244 A | 11/2011 |
| TW | I1269615 B | 12/2006 |
| TW | I272194 B | 2/2007 |
| WO | WO 87/07218 A1 | 12/1987 |
| WO | WO 89/02658 A1 | 3/1989 |
| WO | WO 94/18433 A1 | 8/1994 |
| WO | WO 95/08905 A1 | 3/1995 |
| WO | WO 96/26364 A2 | 8/1996 |
| WO | WO 97/15876 A1 | 5/1997 |
| WO | WO 98/19208 A2 | 5/1998 |
| WO | WO 98/35529 A2 | 8/1998 |
| WO | WO 98/45677 A2 | 10/1998 |
| WO | WO 99/17929 A1 | 4/1999 |
| WO | WO 99/23749 A1 | 5/1999 |
| WO | WO 99/37921 A1 | 7/1999 |
| WO | WO 01/01025 A2 | 1/2001 |
| WO | WO 01/06575 A1 | 1/2001 |
| WO | WO 01/06579 A2 | 1/2001 |
| WO | WO 01/58973 A2 | 8/2001 |
| WO | WO 01/59852 A2 | 8/2001 |
| WO | WO 01/91100 A1 | 11/2001 |
| WO | WO 02/37660 A1 | 5/2002 |
| WO | WO 02/37892 A2 | 5/2002 |
| WO | WO 02/071505 A1 | 9/2002 |
| WO | WO 03/056274 A1 | 7/2003 |
| WO | WO 03/056287 A1 | 7/2003 |
| WO | WO 03/081762 A1 | 10/2003 |
| WO | WO 03/107523 A1 | 12/2003 |
| WO | WO 2004/009363 A1 | 1/2004 |
| WO | WO 2004/027970 A1 | 4/2004 |
| WO | WO 2004/053782 A1 | 6/2004 |
| WO | WO 2004/074797 A1 | 9/2004 |
| WO | WO 2004/079832 A2 | 9/2004 |
| WO | WO 2004/086289 A2 | 10/2004 |
| WO | WO 2004/093763 A1 | 11/2004 |
| WO | WO 2005/027161 A2 | 3/2005 |
| WO | WO 2005/053002 A2 | 6/2005 |
| WO | WO 2005/079187 A2 | 9/2005 |
| WO | WO 2005/079353 A2 | 9/2005 |
| WO | WO 2005/081676 A2 | 9/2005 |
| WO | WO 2005/086249 A1 | 9/2005 |
| WO | WO 2006/040532 A1 | 4/2006 |
| WO | WO 2006/102273 A2 | 9/2006 |
| WO | WO 2006/121818 A2 | 11/2006 |
| WO | WO 2006/123317 A2 | 11/2006 |
| WO | WO 2007/018877 A2 | 2/2007 |
| WO | WO 2007/029275 A1 | 3/2007 |
| WO | WO 2007/072411 A1 | 6/2007 |
| WO | WO 2008/039658 A2 | 4/2008 |
| WO | WO 2008/052559 A2 | 5/2008 |
| WO | WO 2008/105861 A2 | 9/2008 |
| WO | WO 2008/150817 A1 | 12/2008 |
| WO | WO 2009/006318 A1 | 1/2009 |
| WO | WO 2009/056497 A1 | 5/2009 |
| WO | WO 2009/076477 A1 | 6/2009 |
| WO | WO 2009/112988 A1 | 9/2009 |
| WO | WO 2010/054014 A1 | 5/2010 |
| WO | WO 2010/104953 A1 | 9/2010 |
| WO | WO 2010/115549 A1 | 10/2010 |
| WO | WO/ 2011/097020 A2 | 8/2011 |
| WO | WO 2011/118315 A1 | 9/2011 |
| WO | WO 2012/032437 A1 | 3/2012 |
| WO | WO 2012/044419 A1 | 4/2012 |
| WO | WO 2012/099854 A1 | 7/2012 |
| WO | WO 2012/118916 A2 | 9/2012 |
| WO | WO 2012/129357 A2 | 9/2012 |
| WO | WO 2012/148644 A2 | 11/2012 |
| WO | WO 2013/044195 A2 | 3/2013 |
| WO | WO 2013/055733 A1 | 4/2013 |
| WO | WO 2013/103470 A1 | 7/2013 |
| WO | WO 2013/142552 A1 | 9/2013 |
| WO | WO 2013/155377 A1 | 10/2013 |
| WO | WO 2013/192143 A1 | 12/2013 |
| WO | WO 2014/028819 A1 | 2/2014 |
| WO | WO 2014/028822 A1 | 2/2014 |
| WO | WO 2014/028825 A1 | 2/2014 |
| WO | WO 2014/062776 A1 | 4/2014 |
| WO | WO 2014/074554 A2 | 5/2014 |
| WO | WO 2014/089388 A2 | 6/2014 |
| WO | WO 2014/187976 A1 | 11/2014 |
| WO | WO 2015/020698 A2 | 2/2015 |
| WO | WO 2015/051291 A1 | 4/2015 |
| WO | WO 2015/126928 A1 | 8/2015 |
| WO | WO 2015/126928 A4 | 12/2015 |

OTHER PUBLICATIONS

Ajluni, Cheryl, "Pressure Sensors Strive to Stay on Top, New Silicon Micromachining Techniques and Designs Promise Higher Performance," Electronic Design—Advanced Technology Series, Oct. 3, 1994, pp. 67-74.

Akle, Barbar J., et al., "Ionic Electroactive Hybrid Transducers," Smart Structures and Materials 2005: Electroactive Polymer Actuators and Devices (EAPAD), Proceedings of SPIE, Bellingham, WA, vol. 5759, 2005, pp. 153-164.

Anderson, R.A., "Mechanical Stress in a Delectric Solid From a Uniform Electric Field," The American Physical Society, 1986, pp. 1302-1307.

Aramaki, S., S. Kaneko, K. Arai, Y. Takahashi, H. Adachi, and K. Yanagisawa. 1995. "Tube Type Micro Manipulator Using Shape Memory Alloy (SMA)," Proceedings of the IEEE Sixth International Symposium on Micro Machine and Human Science, Nagoya, Japan, pp. 115-120.

Ashley, S., "Artificial Muscles", Scientific American 2003, pp. 53-59.

Ashley, S., "Smart Skis and Other Adaptive Structures," Mechanical Engineering, Nov. 1995, pp. 77-81.

Bar-Cohen, Yoseph, JPL, WorldWide ElectroActive Polymers, EAP (Artificial Muscles) Newsletter, vol. 1, No. 1, Jun. 1999.

Bar-Cohen, Yoseph, JPL, WorldWide ElectroActive Polymers, EAP (Artificial Muscles) Newsletter, vol. 1, No. 2, Dec. 1999.

(56) References Cited

OTHER PUBLICATIONS

Bar-Cohen, Yoseph, JPL, WorldWide ElectroActive Polymers, EAP (Artificial Muscles) Newsletter, vol. 2, No. 1, Jul. 2000.
Bar-Cohen, Yoseph, JPL, WorldWide ElectroActive Polymers, EAP (Artificial Muscles) Newsletter, vol. 2, No. 2, Dec. 2000.
Bar-Cohen, Yoseph, JPL, WorldWide ElectroActive Polymers, EAP (Artificial Muscles) Newsletter, vol. 3, No. 1, Jun. 2001.
Bar-Cohen, Yoseph, JPL, WorldWide ElectroActive Polymer Actuators Webhub webpages 1-7, http://ndeaa.jpl.nasa.gov/nasa-nde/lommas/eap/EAP-web.htm, downloaded Jul. 23, 2001 (7 pages).
Baughman, R., L. Shacklette, R. Elsenbaumer, E. Plichta, and C. Becht "Conducting Polymer Electromechanical Actuators," Conjugated Polymeric Materials: Opportunities in Electronics, Optoelectronics and Molecular Electronics, eds. J.L. Bredas and R.R. Chance, Kluwer Academic Publishers, The Netherlands, pp. 559-582, 1990.
Baughman, R.H., L.W. Shacklette, R.L. Elsenbaumer, E.J. Plichta, and C. Becht "Micro electromechanical actuators based on conducting polymers," in Molecular Electronics, Materials and Methods, P.I. Lazarev (ed.), Kluwer Academic Publishers, pp. 267-289 (1991).
Beckett, J., "New Robotics Tap the Mind, Help the Heart, SRI shows of latest technologies," San Francisco Chronicle, Aug. 27, 1998.
Begley, M. et al., "The Electro-Mechanical Response to Highly Compliant Substrates and Thin Stiff Films with Periodic Cracks," International Journal of Solids and Structures, 42:5259-5273, 2005.
Benslimane, M and P. Gravesen, "Mechanical Properties of Dielectric Elastomer Actuators with Smart Metallic Compliant Electrodes," Proceedings of SPIE, International Society for Optical Engineering, vol. 4695, Jan. 1, 2002, pp. 150-157.
Bharti, V., Y. Ye, T.-B. Xu and Q.M. Zhang, "Correlation Between Large Electrostrictive Strain and Relaxor Behavior with Structural Changes Induced in P(VDF-TrFE) Copolymer by Electron Irradiation," Mat. Res. Soc. Symp. Proc. vol. 541, pp. 653-659 (1999).
Bharti, V., Z.-Y.Cheng S. Gross, T.-B. Xu and Q.M. Zhang, "High Electrostrictive Strain Under High Mechanical Stress in Electron-Irradiated Poly(vinylidene fluoride-trifluoroethylene) Copolymer," Applied Physics Letters, vol. 75, No. 17, pp. 2653-2655 (Oct. 25, 1999).
Bharti, V., H.S. Xu, G. Shanthi and Q.M. Zhang, "Polarization and Structural Properties of High Energy Electron Irradiated Poly(vinylidene fluoride-trifluoroethylene) Copolymer Films," to be published in J. Appl. Phys. (2000).
Bharti, V.,X.-Z. Zhao, Q.M. Zhang, T. Romotowski, F. Tito, and R. Ting, "Ultrahigh Field Induced Strain and Polarization Response in Electron Irradiated Poly(Vinylidene Fluoride-Trifluoroethylene) Copolymer,"Mat. Res. Innovat. vol. 2, pp. 57-63 (1998).
Biomimetic Products, Inc., hhtp://www.biomimetic.com, Jun. 6, 2001.
Bobbio, S., M. Kellam, B. Dudley, S. Goodwin Johansson, S. Jones, J. Jacobson, F. Tranjan, and T. DuBois, "Integrated Force Arrays," in Proc. IEEE Micro Electro Mechanical Systems Workshop, Fort Lauderdale, Florida, Feb. 7-10, 1993, pp. 146-154.
Bohon, K. and S. Krause, "An Electrorheological Fluid and Siloxane Gel Based Electromechanical Actuator: Working Toward an Artificial Muscle," to be published in J. Polymer Sci., Part B. Polymer Phys. (2000).
Boyle, W. et al., "Departure from Paschen's Law of Breakdown in Gases," The Physical Review, Second Series, 97(2): 255-259, Jan. 15, 1955.
Brock, D.L., "Review of Artificial Muscle based on Contractile Polymers," MIT Artificial Intelligence Laboratory, A.I. Memo No. 1330, Nov. 1991.
Caldwell, D., G. Medrano-Cerda, and M. Goodwin, "Characteristics and Adaptive Control of Pneumatic Muscle Actuators for a Robotic Elbow," Proc. IEEE Int. Conference on Robotics and Automation, San Diego, California (May 8-13, 1994).
Calvert, P. and Z. Liu, "Electrically Stimulated Bilayer Hydrogels as Muscles," Proceedings of the SPIE International Symposium on Smart Structures and Materials: Electro-Active Polymer Actuators and Devices, Mar. 1-2, 1999, Newport Beach, California, USA, pp. 236-241.
Campolo, D., et al., "Efficient Charge Recovery Method for Driving Piezoelectric Actuators with Quasi-Square Waves," IEEE Transaction on Ultrasonics, Ferroelectrics and Frequency Control, IEE, US, vol. 50, No. 3, Mar. 1, 2003, pp. 237-244.
Chen et al., "Active control of low-frequency sound radiation from vibrating panel using planar sound sources," Journal of Vibration and Acoustics, vol. 124, pp. 2-9, Jan. 2002.
Chen, Zheng et al., "Quasi-Static Positioning of Ionic Polymer-Metal Composite (IPMC) Actuators," Proceedings of the 2005 IEEE/ASME International Conference on Advanced Intelligent Mechatronics, Monterey, California, Jul. 24-28, 2005, pp. 60-65.
Cheng, Z.-Y., H.S. Xu, J. Su, Q. M. Zhjang, P.-C. Wang and A.G. MacDiarmid, "High Performance of All-Polymer Electrostrictive Systems," Proceedings of the SPIE International Symposium on Smart Structures and Materials: Electro-Active Polymer Actuators and Devices, Mar. 1-2, 1999, Newport Beach, California, USA, pp. 140-148.
Cheng, Z.-Y., T.-B. Xu, V. Bharti, S. Wang, and Q.M. Zhang, "Transverse Strain Responses in The Electrostrictive Poly(Vinylidene Fluoride-Trifluorethylene) Copolymer," Appl. Phs. Lett. vol. 74, No. 13, pp. 1901-1903, Mar. 29, 1999.
Chiarelli, P., A. Della Santa, D. DeRossi, and A. Mazzoldi, "Actuation Properties of Electrochemically Driven Polypyrrole Free-Standing Films," Journal of Intelligent Material Systems and Structures, vol. 6, pp. 32-37, Jan. 1995.
Delille, R. et al., "Novel Compliant Electrodes Based on Platinum Salt Reduction," Smart Structures and Materials 2006: Electroactive Polymer Actuators and Devices (EAPAD), edited by Yoseph Bar-Cohen, Proceedings of SPIE, 6168 (6168Q), 2006.
De Rossi, D., and P. Chiarelli, "Biomimetic Macromolecular Actuators," Macro-Ion Characterization, American Chemical Society Symposium Series, vol. 548, Ch. 40, pp. 517-530 (1994).
Dowling, K., Beyond Faraday-NonTraditional Actuation, available on the World Wide Web at http://www.frc.ri.cmu.edu/~nivek/OTH/beyond-faraday/beyondfaraday.html, 9 pages, 1994.
Egawa, S. and T. Higuchi, "Multi-Layered Electrostatic Film Actuator," Proc. IEEE Micro Electra Mechanical Systems, Napa Valley, California, pp. 166-171 (Feb. 11-14, 1990).
Elhami, K. B. Gauthier-Manuel, "Electrostriction of the Copolymer of Vinylidene-Fluoride and Trifluoroethylene," J. Appl. Phys. vol. 77 (8), 3987-3990, Apr. 15, 1995.
Flynn, Anita M., L.S. Tavrow, S.F. Bart, R.A. Brooks, D.J. Ehrlich, Kr.R. Udayakumar, and L.E. Cross. 1992. "Piezoelectric Micromotors for Microrobots," IEEE Journal of Microelectromechanical Systems, vol. 1, No. 1, pp. 44-51 (Mar. 1992); also published as MIT AI Laboratory Memo 1269, Massachusetts Institute of Technology (Feb. 1991).
Ford, V. and J. Kievet, "Technical Support Package on Traveling-Wave Rotary Actuators", NASA Tech Brief, vol. 21, No. 10, Item #145, from JPL New Technology Report NPO-19261, Oct. 1997.
Full, R.J. and K. Meijer, "Artificial Muscles Versus Natural Actuators from Frogs to Flies," Proceedings of the 7th SPIE Symposium on Smart Structures and Materials-Electroactive Polymers and Devices (EAPAD) Conference, Mar. 6-8, 2000, Newport Beach, California, USA, pp. 2-9.
Furuhata, T., T. Hirano, and H. Fujita, "Array-Driven Ultrasonic Microactuators," Solid State Sensors and Actuators, 1991, Digest of Tech. Papers, Transducers, pp. 1056-1059.
Furukawa, T. and N. Seo, "Electrostriction as the Origin of Piezoelectricity in Ferroelectric Polymers," Japanese J. Applied Physics, vol. 29, No. 4, pp. 675-680 (Apr. 1990).
Gardner, J.W., "Microsensors: Principles and Applications," John Wiley, 1994. (Book—not attached).
Ghaffarian, S.R., et al., "Electrode Structures in High Strain Actuator Technology," Journal of Optoelectronics and Advanced Materials, Nov. 2007, 9(11), pp. 3585-3591.
Gilbertson, R.G. and J.D. Busch. "Survey of MicroActuator Technologies for Future Spacecraft Missions," presented a the conference entitled "Practical Robotic Interstellar Flight: Are We Ready?" New York University and The United Nations, New York. (Aug. 29

(56) References Cited

OTHER PUBLICATIONS and Sep. 1, 1994); also published on the World Wide Web at http://nonothinc.com/nanosci/microtech/mems/ten-actuators/gilbertson.html.
Goldberg, Lee, "Adaptive-Filtering Developments Extend Noise-Cancellation Applications," Electronic Design, Feb. 6, 1995, pp. 34 and 36.
Greene, M. J.A. Willett, and R. Kornbluh, "Robotic Systems," in ONR Report 32198-2, Ocean Engineering and Marine Systems 1997 Program (Dec. 1997).
Greenland, P. Allegro Microsystems Inc., and B. Carsten, Bruce Carsten Associates, "Stacked Flyback Converters Allow Lower Voltage MOSFETs for High AC Line Voltage Operation," Feature PCIM Article, PCIM, Mar. 2000.
Hansen, G., "High Aspect Ratio Sub-Micron and Nano-Scale Metal Filaments," SAMPE Journal, 41(2): 24-33, 2005.
Heydt, R., R. Pelrine, J. Joseph, J. Eckerle, and R. Kornbluh, "Acoustical Performance of an Electrostrictive Polymer Film Loudspeaker," Journal of the Acoustical Society of America, vol. 107(2), pp. 833-839 (Feb. 2000).
Heydt, R., R. Kornbluh, R. Pelrine, and B. Mason, "Design and Performance of an Electrostrictive Polymer Film Acoustic Actuator," Journal of Sound and Vibration (1998) 215(2), 297-311.
Hirano, M., K. Yanagisawa, H. Kuwano, and S. Nakano, "Microvalve with Ultra-Low Leakage," Tenth Annual International Workshop on Micro Electromechanical Systems, Nagoya, Japan, IEEE Proceedings (Jan. 26-30, 1997), pp. 323-326.
Hirose, S., Biologically Inspired Robots: Snake-like Locomotors and Manipulators, "Development of the ACM as a Manipulator," Oxford University Press, New York, 1993, pp. 170-172.
http://www.neurosupplies.com/pdf_files/transducers.pdf, printed from web Jul. 25, 2001.
Huang, Cheng et al., "Colossal Dielectric and Electromechanical Responses in Self-Assembled Polymeric Nanocomposites", Applied Physics Letters 87, 182901 (2005), pp. 182901-1 through 182901-3.
Hunter, I.W. and S. Lafontaine, "A Comparison of Muscle with Artificial Actuators," Technical Digest of the IEEE Solid-State Sensor and Actuator Workshop, Hilton Head, South Carolina, Jun. 22-25, 1992, pp. 178-185.
Hunter, I., S. Lafontaine, J. Hollerbach, and P. Hunter, "Fast Reversible NiTi Fibers for Use in MicroRobotics," Proc. 1991 IEEE Micro Electro Mechanical Systems-MEMS '91, Nara, Japan, pp. 166-170.
Jacobsen, S., R. Price, J. Wood, T. Rytting and M. Rafaelof, "A Design Overview of an Eccentric-Motion Electrostatic Microactuator (the Wobble Motor)", Sensors and Actuators, 20 (1989) pp. 1-16.
Joseph, J., R. Pelrine, J. Eckerle, J. Bashkin, and P. Mulgaonkar, "Micro Electrochemical Composite Sensor", SRI International, printed from web Jul. 25, 2001.
Kaneto, K., M. Kaneko, Y. Min, and A.G. MacDiarmid, "Artifical Muscle: Electromechanical Actuators Using Polyaniline Films," Synthetic Metals 71, pp. 2211-2212, 1995.
Kawamura, S., K. Minani, and M. Esashi, "Fundamental Research of Distributed Electrostatic Micro Actuator," Technical Digest of the 11th Sensor Symposium, pp. 27-30 (1992).
Khuri-Yakub et al., "Silicon micromachined ultrasonic transducers," Japan Journal of Applied Physics, vol. 39 (2000), pp. 2883-2887, Par 1, No. 5B, May 2000.
Kinsler et al., Fundamentals of Acoustics, Third Edition, John Wiley and Sons, 1982.
Kondoh, Y., and T. Ono. 1991. "Bimorph Type Actuators using Lead Zinc Niobate-based Ceramics," Japanese Journal of Applied Physics, vol. 30, No. 9B, pp. 2260-2263, Sep. 1991.
Kornbluh, R., R. Pelrine, R. Heydt, and Q. Pei, "Acoustic Actuators Based on the Field-Activated Deformation of Dielectric Elastomers," (2000).
Kornbluh, R., G. Andeen, and J. Eckerle, "Artificial Muscle: The Next Generation of Robotic Actuators," presented at the Fourth World Conference on Robotics Research, SME Paper M591-331, Pittsburgh, PA, Sep. 17-19, 1991.
Kornbluh, R., "Description of Children's Tour," Aug. 20, 2000.
Kornbluh, R. D and R. E. Pelrine., "Dexterous Multiarticulated Manipulator with Electrostrictive Polymer Artificial Muscle," ITAD-7247-QR-96-175, SRI Project No. 7247, Prepared for Office of Naval Research, Nov. 1996.
Kornbluh, R., R. Pelrine, J. Joseph, "Elastomeric Dielectric Artificial Muscle Actuators for Small Robots," Proceedings of the Third IASTED International Conference on Robotics and Manufacturing, Jun. 14-16, 1995, Cancun, Mexico.
Kornbluh, R., R. Pelrine, Q. Pei, and V. Shastri "Electroactive Polymer (EAP) Actuators as Artificial Muscles—Reality, Potential and Challenges", Chapter 16, Application of Dielectric EAP Actuators, SPIE Press, May 2001.
Kornbluh, R. et al., "Electroactive polymers: An emerging technology for MEMS," (invited) in MEMS/MOEMS Components and Their Applications, eds. S. Janson, W. Siegfried, and A. Henning, Proc. SPIE, 5344:13-27, 2004.
Kornbluh, R. et al., "Electroelastomers: Applications of dielectric elastomer transducers for actuation, generation and smart structures," Smart Structures and Materials 2002: Industrial and Commercial Applications of Smart Structures Technologies, ed., A. McGowan, Proc. SPIE, 4698:254-270, 2002.
Kornbluh, R., Pelrine, R., Eckerie, J., Joseph, J., "Electrostrictive Polymer Artificial Muscle Actuators," IEEE International Conference on Robotic and Automation, Leuven, Belgium, 1998.
Kornbluh, R., R. Pelrine, Jose Joseph, Richard Heydt, Qibing Pei, Seiki Chiba, 1999. "High-Field Electrostriction of Elastomeric Polymer Dielectrics for Actuation", Proceedings of the SPIE International Symposium on Smart Structures and Materials: Electro-Active Polymer Actuators and Devices, Mar. 1-2, 1999, Newport Beach, California, USA. pp. 149-161.
Kornbluh et al., "Medical Applications of New Electroactive Polymer Artificial Muscles," SRI International, Menlo Park, CA, JSPP, v. 16, 2004.
Kornbluh, Roy D., Robotic Systems, Ocean Engineering and Marine Systems, 2000 Program, Jan. 2001, Office of Naval Research Public Release, ONR-32100-1.
Kornbluh, Roy D., Robotic Systems, Ocean Engineering and Marine Systems, 1999 Program, Feb. 2000, Office of Naval Research Public Release, ONR-32100-2.
Kornbluh, Roy D., Robotic Systems, Ocean Engineering and Marine Systems, 1997 Program, Dec. 1997, Office of Naval Research Public Release, ONR-32198-2.
Kornbluh, Roy D., Robotic Systems, Ocean Engineering and Marine Systems, 1998 Program, Feb. 1999, Office of Naval Research Public Release, ONR-32199-4.
Kornbluh, R., "Presentation to Colin Corporation", Jan. 1997.
Kornbluh, R. Presentation to Medtronic, "Elastomeric Polymer Actuator and Transducers: The Principles, Performance and Applications of a New High-Strain Smart Material Technology", SRI International Medtronic Forum, Brooklyn Center, Minnesota, Jan. 2000.Jan. 2000.
Kornbluh, R. et al., "Shape control of large lightweight mirrors with dielectric elastomer actuation," Actuation Smart Structures and Materials 2003: Electroactive Polymer Actuators and Devices, ed. Y. Bar-Cohen, Proc. SPIE, 5051, 2003.
Kornbluh, R., Pelrine, R. Joseph, J., Pei, Q. and Chiba., "Ultra-High Strain Response of Elastomeric Polymer Dielectrics", Proc. Materials Res. Soc., Fall meeting, Boston, MA, pp. 1-12, Dec. 1999.
Kornbluh, R., R. Pelrine, Q. Pei, S. Oh, and J. Joseph, 2000. "Ultrahigh Strain Response of Field-Actuated Elastomeric Polymers," Proceedings of the 7th SPIE Symposium on Smart Structures and Materials-Electroactive Polymers and Devices (EAPAD) Conference, Mar. 6-8, 2000, Newport Beach, California, USA, pp. 51-64.
Kornbluh, R., "Use of Artificial Muscle Butterfly for Chronicle Newspaper Photograph," Aug. 1998.
Ktech's PVDF Sensors, http://www.ktech.com/pvdf.htm, Jun. 6, 2001, pp. 1-5.

(56) References Cited

OTHER PUBLICATIONS

Kymissis et al., "Parasitic Power Harvesting in Shoes," XP-010312825—Abstract, Physics and Media Group, MIT Media Laboratory E15-410, Cambridge, MA, Oct. 19, 1998, pp. 132-139.
Lacour, S. et al., "Mechanisms of Reversible Stretchability of Thin Metal Films on Elastomeric Substrates," Applied Physics Letters 88, 204103, 2006.
Lacour, S. et al., "Stretchable Interconnects for Elastic Electronic Surfaces," Proceedings of the IEEE on Flexible Electronics Technology, 93(8): 1459-1467, 2005.
Lakes, R.S., "Extreme damping in compliant composites with a negative stiffness phase" or "Extreme Damping in Composite Materials with Negative Stiffness Inclusions", Nature, 410, 565-567, Mar. 2001.
Lakes, R.S., "Extreme damping in compliant composites with a negative stiffness phase", Philosophical Magazine Letters, 81, 95-100 (2001).
Lakes, R.S., "Extreme damping in compliant composites with a negative stiffness phase" or "Extreme Damping in Composite Materials with a Negative Stiffness Phase", Physical Review Letters, 86, 2897-2900, Mar. 26, 2001.
Lang, J, M. Schlect, and R. Howe, "Electric Micromotors: Electromechanical Characteristics," Proc. IEEE Micro Robots and Teleoperators Workshop, Hyannis, Massachusetts (Nov. 9-11, 1987).
Lawless, W. and R. Arenz, "Miniature Solid-state Gas Compressor," Rev. Sci Instrum., 58(8), pp. 1487-1493, Aug. 1987.
Liu, C., Y. Bar-Cohen, and S. Leary, "Electro-statically stricted polymers (ESSP)," Proceedings of the SPIE International Symposium on Smart Structures and Materials: Electro-Active Polymer Actuators and Devices, Mar. 1-2, 1999, Newport Beach, California, USA., pp. 186-190.
Liu, C. & Y. Bar-Cohen, "Scaling Laws of Microactuators and Potential Applications of Electroactive Polymers in MEMS", SPIE, Conference on Electroactive Polymer Actuators and Devices, Newport Beach, CA Mar. 1999.
Liu, Y., T. Zeng, Y.X. Wang, H. Yu, and R. Claus, "Self-Assembled Flexible Electrodes on Electroactive Polymer Actuators," Proceedings of the SPIE International Symposium on Smart Structures and Materials: Electro-Active Polymer Actuators and Devices, Mar. 1-2, 1999, Newport Beach, California, USA., pp. 284-288.
Madden et al., "Conducting polymer actuators as engineering materials," SPIE: Smart Materials and Structures, ed. Yoseph Bar-Cohen, Bellingham, WA, pp. 176-190, Pub 2002.
Madden, J.D. et al., "Fast contracting polypyrrole actuators", Jan. 6, 2000, Elsevier Science S.A., pp. 185-192.
Martin, J. and R. Anderson, 1999. "Electrostriction in Field-Structured Composites: Basis for a Fast Artificial Muscle?", The Journal of Chemical Physics, vol. 111, No. 9, pp. 4273-4280, Sep. 1, 1999.
Measurements Specialties, Inc.-Piezo Home, http://www.msiusa.com/piezo/index.htm, Jun. 6, 2001.
Möller, S. et al., A Polymer/semiconductor write-once read-many-times memory, Nature, vol. 26, Nov. 13, 2003, pp. 166-169, Nature Publishing Group.
Nguyen, T.B., C.K. DeBolt, S.V. Shastri and A. Mann, "Advanced Robotic Search," in ONR Ocean, Atmosphere, and Space Fiscal Year 1999 Annual Reports (Dec. 1999).
Nguyen, T., J. A. Willett and Kornbluh, R., "Robotic systems," in ONR Ocean, Atmosphere, and Space Fiscal Year 1998 Annual Reports (Dec. 1998).
Nguyen, T., Green, M., and Kornbluh, R., "Robotic Systems," in ONR Ocean, Atmosphere, and Space Fiscal Year 1999 Annual Reports (Dec. 1999).
Nguyen, T., Green, M., and Kornbluh, R., "Robotic Systems," in ONR Ocean, Atmosphere, and Space Fiscal Year 2000 Annual Reports (Jan. 2001). (Cited in U.S. Pat. No. 7,211,937 however, unable to locate).
Nihon Kohden Corporation, Operators Manual, available Oct. 1, 2001.
NXT plc, Huntingdon, UK (www.nxtsound.com) Sep. 17, 2008.
Ohara, K., M. Hennecke, and J. Fuhrmann, "Electrostriction of polymethylmethacrylates," Colloid & Polymer Sci. vol. 280, 164-168 (1982).
Olsson, A., G. Stemme, and E. Stemme, "The First Valve-less Diffuser Gas Pump," Tenth Annual International Workshop on Micro Electromechanical Systems, Nagoya, Japan, IEEE Proceedings (Jan. 26-30, 1997), pp. 108-113.
Olsson, A., O. Larsson, J. Holm, L. Lundbladh, O. Ohinan, and G. Stemme. 1997. "Valve-less Diffuser Micropumps Fabricated using Thermoplastic Replication," Proc. IEEE Micro Electro Mechanical Systems, Nagoya, Japan, pp. 305-310 (Jan. 26-30, 1997).
Osterbacka, R. et al., "Two-Dimensional Electronic Excitations in Self-Assembled Conjugated Polymer Nanocrystals," Science, vol. 287:839-842, Feb. 4, 2000.
Otero, T.F., J. Rodriguez, E. Angulo and C. Santamaria, "Artificial Muscles from Bilayer Structures," Synthetic Metals, vol. 55-57, pp. 3713-3717 (1993).
Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333-338, 1994.
Park, S.E., and T. Shrout., "Ultrahigh Strain and Piezoelectric Behavior in Relaxor Based Ferroelectric Single Crystals," J. Appl. Phys., vol. 82, No. 4, pp. 1804-1811, Aug. 15, 1997.
Pei, Q., O. Inganäs, and I. Lundström, "Bending Bilayer Strips Built From Polyaniline for Artificial Electrochemical Muscles," Smart Materials and Structures, vol. 2, pp. 1-6., Jan. 22, 1993.
Pei, Qibing "Description of Conference Demonstration" Mar. 2001.
Pei et al., "Electrochemical Applications of the Bending Beam Method. 1. Mass Transport and Volume Changes in Polypyrrole During Redox," J. Phys. Chem., 1992, 96, pp. 10507-10514.
Pei, Q. et al., "Multifunctional Electroelastomer Roll Actuators and Their Application for Biomimetic Walking Robots," Smart Structures and Materials 2003. Electroactive Polymer Actuators and Devices, San Diego, CA, USA, Mar. 2003, vol. 5051, 2003, pp. 281-290, XP002291729, Proceedings of the SPIE, ISSN: 0277-786X, the whole document.
Pei, Q. et al., "Multifunctional Electroelastomer Rolls," Mat. Res. Soc. Symp. Proc., vol. 698, Nov. 26-30, 2001, Boston, MA, pp. 165-170.
Pei, Q., Pelrine, R., Kornbluh, R., Jonasdottir, S., Shastri, V., Full, R., "Multifunctional Electroelastomers: Electroactive Polymers Combining Structural, Actuating, and Sensing Functions," ITAD-433-PA-00-123, University of California at Berkeley, Berkeley, CA, available at www.sri.com-publications, Jan. 17, 2001.
Pei, Q. et al., "Recent Progress on Electroelastomer Artificial Muscles and Their Application for Biomimetic Robots", SPIE, Pub. Jun. 2004, 11 pages.
Pelrine, R. et al., "Applications of dielectric elastomer actuators," (invited paper) in Smart Structures and Materials 2001: Electroactive Polymer Actuators and Devices, ed., Y. Bar Cohen, Proc. SPIE, 4329:335-349, 2001.
Pelrine, R. and Kornbluh, R., and. 1995. "Dexterous Multiarticulated Manipulator with Electrostrictive Polymer Artificial Muscle Actuator," EMU 95-023, SRI International, Menlo Park, California, Apr. 28, 1995.
Pelrine, R., R. Kornbluh, and J. Joseph, "Electrostriction of Polymer Dielectrics with Compliant Electrodes as a Means of Actuation," Sensors and Actuators A: Physical, vol. 64, No. 1, 1998, pp. 77-85.
Pelrine, R., R. Kornbluh, J. Joseph and S. Chiba, "Electrostriction of Polymer Films for Microactuators," Proc. IEEE Tenth Annual International Workshop on Micro Electro Mechanical Systems, Nagoya, Japan, Jan. 26-30, 1997, pp. 238-243.
Pelrine et al., "Electrostrictive Polymer Artificial Muscle Actuators," May 1998, Proc. of the 1998 IEEE Conf. on Robotics & Automation, pp. 2147-2154.
Pelrine, R., R. Kornbluh, and J. Joseph, FY 1992 Final Report on Artificial Muscle for Small Robots, ITAD-3393-FR-93-063, SRI International, Menlo Park, California, Mar. 1993.
Pelrine, R., R. Kornbluh, and J. Joseph, FY 1993 Final Report on Artificial Muscle for Small Robots, ITAD-4570-FR-94-076, SRI International, Menlo Park, California, 1994.

(56) References Cited

OTHER PUBLICATIONS

Pelrine, R., R. Kornbluh, and J. Joseph, FY 1994 Final Report on Artificial Muscle for Small Robots, ITAD-5782-FR-95-050, SRI International, Menlo Park, California, 1995.
Pelrine, R., R. Kornbluh, and J. Joseph, FY 1995 Final Report on Artificial Muscle for Small Robots, ITAD-7071-FR-96-047, SRI International, Menlo Park, California, 1996.
Pelrine, R., R. Kornbluh, and J. Joseph, FY 1996 Final Report on Artificial Muscle for Small Robots, ITAD-7228-FR-97-058, SRI International, Menlo Park, California, 1997.
Pelrine, R., R. Kornbluh, and J. Joseph, FY 1997 Final Report on Artificial Muscle for Small Robots, ITAD-1612-FR-98-041, SRI International, Menlo Park, California, 1998.
Pelrine, R., R. Kornbluh, and J. Joseph, FY 1998 Final Report on Artificial Muscle for Small Robots, ITAD-3482-FR-99-36, SRI International, Menlo Park, California, 1999.
Pelrine, R., R. Kornbluh, and J. Joseph, FY 1999 Final Report on Artificial Muscle for Small Robots, ITAD-10162-FR-00-27, SRI International, Menlo Park, California, 2000.
Pelrine, R., R. Kornbluh, Q. Pei, and J. Joseph, "High Speed Electrically Actuated Elastomers with Over 100% Strain," Science, vol. 287, No. 5454, pp. 1-21, 2000.
Pelrine, R., R. Kornbluh, Q. Pei, and J. Joseph. "High Speed Electrically Actuated Elastomers with Strain Greater Than 100%", Science, Reprint Series, Feb. 4, 2000, vol. 287, pp. 836-839.
Pelrine, R., R. Kornbluh, and G. Kofod, "High Strain Actuator Materials Based on Dielectric Elastomers," submitted to Advanced Materials (May 2000).
Pelrine, R., Roy Kornbluh, Jose Joseph, Qibing Pei, Seiki Chiba "Recent Progress in Artificial Muscle Micro Actuators," SRI Interational, Tokyo, 1999 MITI/NEEDOIMNIC, 1999.
Pelrine, R., R. Kornbluh, J. Joseph and S. Chiba, "Review of Artificial Muscle Approaches," invited paper, in Proc. Third International Symposium on Micro Machine and Human Science, Nagoya, Japan, Oct. 14-16, 1992.
Piezoflex(TM) PVDF Polymer Sensors, http://www.airmar.com/piezo/pvdf.htm. Jun. 6, 2001.
Polyoxymethylene urea NPL document, retrieved Nov. 11, 2015.
PowerLab ADInstruments, MLT001 High-Sensitivity Force Transducers, AD Instruments Transducers Series, printed from web Jul. 25, 2001.
Prahlad, H. et al., "Programmable Surface Deformation: Thickness-Mode Electroactive Polymer Actuators and their Applications," Proc. SPIE, vol. 5759, 102, 2005, 12 pages.
Puers et al, "A Capacitive Pressure Sensor with Low Impedance Output and Active Suppression of Parasitic Effects," Sensors and Actuators, A21-A23 (1990) 108-114.
Puers, Robert, "Capacitive sensors: when and how to use them," Sensors and Actuators A, 37-38 (1993) 93-105.
Reed, C. et al., "The Fundamentals of Aging HV Polymer-Film Capacitors," IEEE Transactions on Dielectrics and Electrical Insulation, 1(5): 904-922, 1994.
Sakarya, S., "Micromachining Techniques for Fabrication of Integrated Light Modulating Devices", Netherlands 2003, pp. 1-133.
Scheinbeim, J., B. Newman, Z. Ma, and J. Lee, "Electrostrictive Response of Elastomeric Polymers," ACS Polymer Preprints, 33(2), pp. 385-386, 1992.
Schlaberg, H. I., and J. S. Duffy, "Piezoelectric Polymer Composite Arrays for Ultrasonic Medical Imaging Applications," Sensors and Actuators, A 44, pp. 111-117, Feb. 22, 1994.
Seoul et al., "Electrospinning of Poly(vinylidene fluoride) Dimethylformamide Solutions with Carbon Nanotubes," Department of Textile Engineering, Inha University, Mar. 31, 2003.
Shahinpoor, M., "Micro-electro-mechanics of Ionic Polymer Gels as Electrically Controllable Artificial Muscles," J. Intelligent Material Systems and Structures, vol. 6, pp. 307-314, May 1995.
Shkel, Y. and D. Klingenberg, "Material Parameters for Electrostriction," J. Applied Physics, vol. 80(8), pp. 4566-4572, Oct. 15, 1996.
Smela, E., O. Inganas, and I. Lundstrom, "Controlled Folding of Micrometer-size Structures," Science, vol. 268, pp. 1735-1738 (Jun. 23, 1995).
Smela, E., O. Inganas, Q. Pei and I. Lundstrom, "Electrochemical Muscles: Micromachining Fingers and Corkscrews," Advanced Materials, vol. 5, No. 9, pp. 630-632, Sep. 1993.
Smith, S. et al., A low switching voltage organic-on-inorganic heterojunction memory element utilizing a conductive polymer fuse on a doped silicon substrate, Applied Physics Letters, vol. 84, No. 24, May 28, 2004, pp. 5019-5021.
Sokolova, M. et al., "Influence of a Bias Voltage on the Characteristics of Surface Discharges in Dry Air," Plasma Processes and Polymers, 2: 162-169, 2005.
Sommer-Larsen, P. and A. Ladegaard Larsen, "Materials for Dielectric Elastomer Actuators," SPIE, vol. 5385, Mar. 1, 2004, pp. 68-77.
Standard Test Methods for Rubber Deterioration—Cracking in an Ozone Controlled Environment, ASTM International, D 1149-07.
Su, J., Q.M. Zhang, C.H. Kim, R.Y. Ting and R. Capps, "Effects of Transitional Phenomena on the Electric Field induced Strain-electrostrictive Response of a Segmented Polyurethane elastomer," pp. 1363-1370, Jan. 20, 1997.
Su, J, Z. Ounaies, J.S. Harrison, Y. Bara-Cohen and S. Leary, "Electromechanically Active Polymer Blends for Actuation," Proceedings of 7th SPIE Symposium on Smart Structures and Materials-Electroactive Polymers and Devices (EAPAD) Conference, Mar. 6-8, 2000, Newport Beach, CA, USA, pp. 65-72.
Suzuki et al., "Sound radiation from convex and concave domes in infinite baffle," Journal of the Acoustical Society of America, vol. 69(2), Jan. 1981.
Technology, http://www.micromuscle.com/html/technology.html, Jun. 6, 2001.
"The Rubbery Ruler", http://www.ph.unimelb.edu.au, printed from web Jul. 25, 2001.
Tobushi, H., S. Hayashi, and S. Kojima, "Mechanical Properties of Shape Memory Polymer of Polyurethane Series," in JSME International Journal, Series I, vol. 35, No. 3, 1992.
Todorov et al, "WWWeb Application for Ferropiezoelectric Ceramic Parameters Calculation", Proceedings 24th International Conference on Microelectronics, vol. 1, May 2004, pp. 507-510.
Treloar, L.R.G., "Mechanics of Rubber Elasticity," J Polymer Science, Polymer Symposium, No. 48, pp. 107-123, 1974.
Uchino, K. 1986. "Electrostrictive Actuators: Materials and Applications," Ceramic Bulletin, 65(4), pp. 647-652, 1986.
Unger et al. (2000), "Monolithic Microfabricated Valves and Pumps by Multilayer Soft Lithography," Science 288:113-116, no month.
Wade, Jr., W.L., R.J. Mannone and M. Binder, "Increased Dielectric Breakdown Strengths of Melt-Extruded Polyporphlene Films," Polymer vol. 34, No. 5, pp. 1093-1094 (1993).
Wax, S.G. and R.R. Sands, "Electroactive Polymer Actuators and Devices," Proceedings of the SPIE International Symposium on Smart Structures and Materials: Electro-Active Polymer Actuators and Devices, Mar. 1-2, 1999, Newport Beach, CA, USA, pp. 2-10.
Whitesides et al. (2001), "Flexible Methods for Microfluidics," Physics Today 52(6):42-47, no month.
Winters, J., "Muscle as an Actuator for Intelligent Robots," Robotics Research: Trans. Robotics International of SME, Scottsdale, AZ (Aug. 18-21, 1986).
Woodard, Improvements of ModalMax High-Fidelity Peizoelectric Audio Device (LAR-16321-1), NASA Tech Briefs, May 2005, p. 36.
Xia, Younan et al., "Triangular Nanoplates of Silver: Synthesis, Characterization, and Use as Sacrificial Templates for Generating Triangular Nanorings of Gold," Adv. Mater., 2003, 15, No. 9, pp. 695-699.
Yam, P., "Plastics Get Wired," Scientific American, vol. 273, pp. 82-87, Jul. 1995.
Yoshio, O., "Ablation Characteristics of Silicone Insulation," Journal of Polymer Science: Part A: Polymer Chemistry, 36: 233-239, 1998.
Yuan, W. et al. "New Electrode Materials for Dielectric Elastomer Actuators," Proc. SPIE, 6524 (6524ON), 2007.
Zhang, Q.M., V. Bharti, Z.Y. Cheng, T.B. Xu, S. Wang, T.S. Ramotowski, F. Tito, and R. Ting, "Electromechanical Behavior of

(56) References Cited

OTHER PUBLICATIONS

Electroactive P(VDF-TrFE) Copolymers," Proceedings of the SPIE International Symposium on Smart Structures and Materials: Electro-Active Polymer Actuators and Devices, Mar. 1-2, 1999, Newport Beach, CA, USA, pp. 134-139.

Zhang, Q., V. Bharti and X. Zhao, "Giant Electrostriction and Relaxor Ferroelectric Behavior in Electron-irradiated Poly(vinylidene fluoride-trifluoroethylene) Copolymer," Science, vol. 280, pp. 2101-2104 (Jun. 26, 1998).

Zhang, Q.M., Z.Y. Cheng, V. Bharti, T.B. Xu, H. Xu, T. Mai and S.J. Gross, "Piezoelectric and Electrostrictive Polymeric Actuator Materials," Proceedings of the 7th SPIE Symposium on Smart Structures and Materials: Electroactive Polymers and Devices (EAPAD) Conference, Mar. 6-8, 2000, Newport Beach, CA, USA, pp. 34-50.

Zhenyi, M., J.I. Scheinbeim, J.W. Lee, and B.A. Newman. 1994. "High Field Electrostrictive Response of Polymers," Journal of Polymer Sciences, Part B-Polymer Physics, vol. 32, pp. 2721-2731, 1994.

U.S. Appl. No. 14/892,762, filed Nov. 20, 2015.
U.S. Appl. No. 15/131,579, filed Apr. 18, 2016.

\* cited by examiner

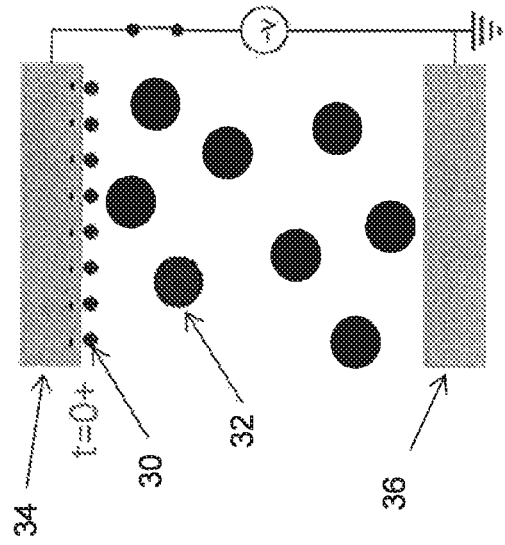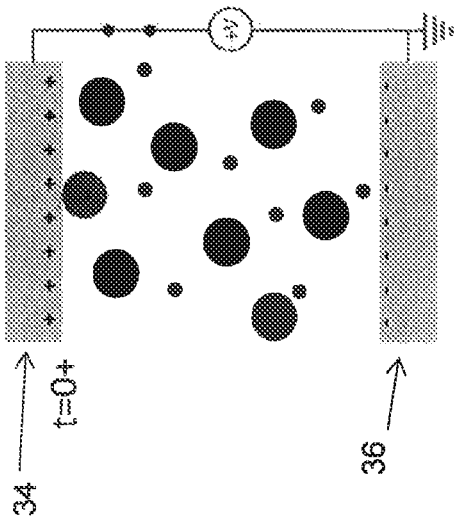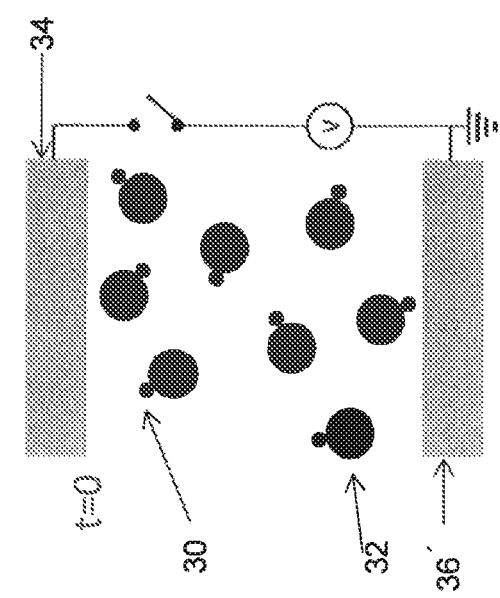

POLYMER DIODE

RELATED APPLICATIONS

This application is the U.S. National Stage application filed under 35 U.S.C. §371(c) of International Application No. PCT/US2013/066504, filed on Oct. 24, 2013, which claims the benefit, under 35 USC §119(e), of U.S. Provisional Application No.: 61/717,780 filed Oct. 24, 2012 entitled "POLYMER DIODE", the entirety of both applications are incorporated herein by reference.

FIELD OF THE INVENTION

The present invention is directed in general to polymer-based electronic devices and in particular to polymer diodes for use in flexible electronic devices.

BACKGROUND OF THE INVENTION

There has been a desire in recent years for flexible electronic devices which in turn has driven a need for flexible electronic components that can be applied to flexible (polymer) substrates at low temperatures. Although polymer and organic light emitting diodes are generally available, reliable, easy to process polymer diodes are not readily available for flexible electronics applications. Some work has been done with wet electrolytic systems. Both solutions require good sealing for long lifetimes. There has been a movement to use high speed. printing and other deposition methods rather than subtractive lithographic methods.

Approaches have generally centered on solution processable semiconductors such as those used in polymer light emitting diodes (PLEDs) sandwiched between electrodes that can be deposited, and optionally sintered, at low temperatures. Many of the semiconducting materials are difficult to process and can have lifetime issues. Some may chemically de-dope and become inactive. In addition, such materials can be sensitive to atmospheric moisture and need to be sealed. Multilayer structures may be difficult to fabricate. Many of these electrode systems require sintering temperatures that can cause damage to the polymer substrate and need to be tailored to have the correct work function for diode operation. Some methods have introduced pressure-annealing or lamination steps to improve the performance of the devices.

For example, Yoshida et al., in *Jpn. Appl. Phys.* 50 (2011) 04DK16 describe a pressure-annealing method for fabricating printed low-work-function metal patterns and printed metal alloy patterns. The pressure-annealed metal electrodes of Yoshida et al., are used as bottom electrodes of printed polymer diodes.

Reports on the development of solution-state polymer diodes with nanogap electrodes that support intra-chain-dominant conduction are provided at http://nanotechweb.org/cws/article/lab/50114.

In all these cases, the diode mechanism has moving charges—electrons and holes—which flow through an electrically (semi-)conductive layer with similar mobilities (relative to the mobilities of any of the molecular species in the layer between the electrodes). Ionic diodes are known in the art but typically these require fluidic electrolytes to enable ionic mobility.

Lee et al., in U.S. Published Patent Application Nos. 2007/0221926 and 20120025174 describe the production of solution-processed titanium oxide layer containing polymer diodes.

There continues to be a need in the art for polymer diodes that are suitable for use in flexible electronics applications.

SUMMARY OF THE INVENTION

Accordingly, the present invention provides such flexible polymer diodes in the form of a printable polymer sandwich configuration similar to that found in electroactive polymer transducers. The inventive flexible polymer diodes comprise a dielectric layer sandwiched between a pair of electrodes. With appropriate optional additives introduced in the electrode formulation and the proper electrical properties in the electrode, a device may be constructed which allows current to pass through for only one polarity of applied voltage.

These and other advantages and benefits of the present invention will be apparent from the Detailed Description of the invention herein below.

BRIEF DESCRIPTION OF THE FIGURES

The present invention will now be described for purposes of illustration and not limitation in conjunction with the figures, wherein:

FIGS. 3A, 3B and 3C show a possible mechanism for the present invention;

DETAILED DESCRIPTION OF THE INVENTION

Figure 1:
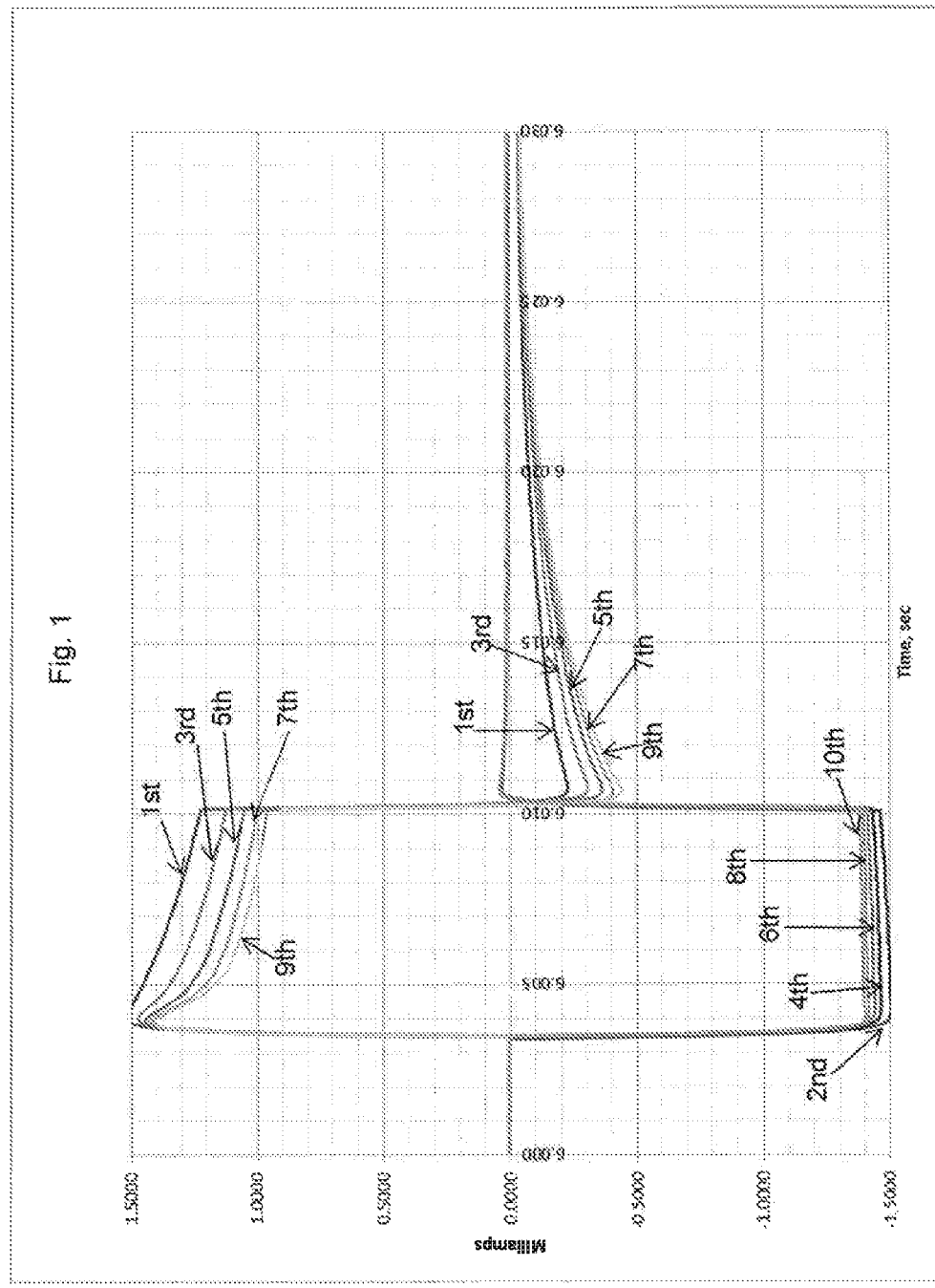
FIG. 1 is a plot showing current vs. time vs. cycle with alternating polarity.

The present invention will now be described for purposes of illustration and not limitation.

Examples of electroactive polymer devices and their applications are described, for example, in U.S. Pat. Nos. 6,343,129; 6,376,971; 6,543,110; 6,545,384; 6,583,533; 6,586,859; 6,628,040; 6,664,718; 6,707,236; 6,768,246; 6,781,284; 6,806,621; 6,809,462; 6,812,624; 6,876,135; 6,882,086; 6,891,317; 6,911,764; 6,940,221; 7,034,432; 7,049,732; 7,052,594; 7,062,055; 7,064,472; 7,166,953; 7,199,501; 7,199,501; 7,211,937; 7,224,106; 7,233,097; 7,259,503; 7,320,457; 7,362,032; 7,368,862; 7,378,783; 7,394,282; 7,436,099; 7,492,076; 7,521,840; 7,521,847; 7,567,681; 7,595,580; 7,608,989; 7,626,319; 7,750,532; 7,761,981; 7,911,761; 7,915,789; 7,952,261; 8,183,739; 8,222,799; 8,248,750; and in U.S. Patent Application Publication Nos.; 2007/0200457; 2007/0230222; 2011/0128239; and 2012/0126959, the entireties of which are incorporated herein by reference.

The present inventors have surprisingly discovered that a polymer diode may be constructed from a simple, printed electroactive polymer material stack as such stacks show consistent difference in measured current based on the polarity of the applied voltage.

This current difference may be enhanced by the inclusion of additives. Mobile, electrically active additives added to the electrode formulation can significantly improve the performance of electroactive polymer material stack. Such additives do not need to be ionic. Although not wishing to be bound to any particular theory, the present inventors speculate that a portion of these electrically active additives diffuse into the dielectric layer. These diffusants may chemically interact with the functional groups of the dielectric layer material, particularly after photo- or thermal exposure.

Chemical modifications of the dielectric film to increase interaction between the polymer matrix and the electrically active additives may enhance performance and long-term stability. The diffusivity of the electrically active additives and their fragments may relate to molecular size and also to their charge or induced charge. The electrically active additives and their fragments may have functional groups that can react or interact with the dielectric matrix to limit their diffusivity. This can enable the creation of permanent concentration gradients in the dielectric layer which may enhance performance.

Additives containing iodonium salts, sulfonium salts and phthalocyanines are preferred as electrically active additives in the present invention. As iodonium salts, the following may be mentioned, phenyl iodonium hexafluorophosphate, diphenyl iodonium hexafluoroantimonate, diphenyl iodonium tetrafluoroborate, diphenyl iodonium tetrakis(pentafluorophenyl)borate, bis(dodecylphenyl)iodonium hexafluorophosphate, bis-(dodecylphenyl)iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methyl-ethyl)phenyl iodonium hexafluorophosphate, 4-methylphenyl-4-(1-methylethyl)phenyl iodonium hexafluoroantimonate, 4-methylphenyl-4-(1-methylethyl)phenyl iodonium tetrafluoroborate, and 4-methylphenyl-4-(1-methylethyl)phenyl iodonium tetrakis(pentafluorophenyl)borate.

As a sulfonium salt, examples include, but are not limited to, bis[4-(diphenylsulfonio)phenyl]sulfide bishexafluorophosphate, bis[4-(diphenylsulfonio)phenyl]sulfide bishexafluoroantimonate, bis[4-(diphenylsulfonio)phenyl]sulfidebistetrafluoroborate, bis[4-(diphenylsulfonio)phenyl]sulfide tetrakis(pentafluorophenyl)borate, diphenyl-4-(phenylthio)phenylsulfonium hexafluorophosphate, diphenyl-4-(phenylthio)phenylsulfonium hexafluoroantimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis(pentafluorophenyl)borate, bis[4-(di-(4-(2-hydroxyethoxy))phenylsulfonio)phenyl]sulfide hishexafluorophosphate, bis[4-(di-(4-(2-hydroxyethoxy))phenylsulfonio)phenyl]sulfide bishexafluoroantimonate, bis[4-(di-(4-(2-hydroxyethoxy))phenylsulfonio)phenyl]sulfidebistetrafluoroborate, and bis[4-(di-(4-(2-hydroxyethoxy))phenylsulfonio)phenyl]sulfide tetrakis(pentafluoro-phenyl)horate, tris({4-[(4-acetylphenyl)sulfanyl]phenyl})sulfanium hexafluorophosphate (commercially available from BASF as IRGACURE PAG270), tris({4-[(4-acetylphenyl)sulfanyl]phenyl})sulfanium tetrakis(pentafluorophenyl)borate (commercially available from BASF as IRGACURE PAG290).

In some embodiments, mixtures of electrically active additives may be used to balance performance, time response, and long-term stability as needed for a particular application. Also, many of these compounds are photo- and thermally labile, and in some embodiments, the polymer film may be photo- or thermally treated to release fragments that are more effective as electrically active additives or that may react with functional groups in the dielectric matrix material. In some embodiments, the photo- or thermal treatment may be used to create permanent compositional gradients within the dielectric layer to reduce diffusional effects.

A particularly preferred additive in the present invention is sodium tetrakis[3,5-bis(trifluoromethyl)phenyl]borate (Formula I);

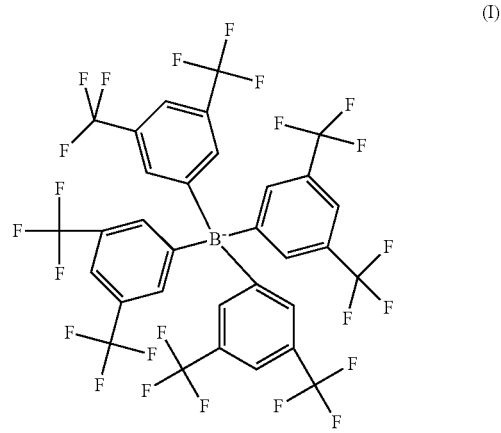 [SMILES: FC(F)(F)c1cc([B-](c2cc(C(F)(F)F)cc(C(F)(F)F)c2)(c2cc(C(F)(F)F)cc(C(F)(F)F)c2)c2cc(C(F)(F)F)cc(C(F)(F)F)c2)cc(C(F)(F)F)c1]

(I)

As can be appreciated by reference to FIG. 1, a plot showing current vs. time vs. cycle with alternating polarity for 10 cycles illustrates the current measured when a positive voltage is applied across the diode (odd cycles) or when a negative voltage is applied across the diode (even cycles). During the odd cycles, it is evident that current changes with time while the voltage is applied indicating that electrical charges are being transferred during the cycle. During the even cycles with negative polarity, the current is constant and the diode behaves as a resistor.

Figure 2:
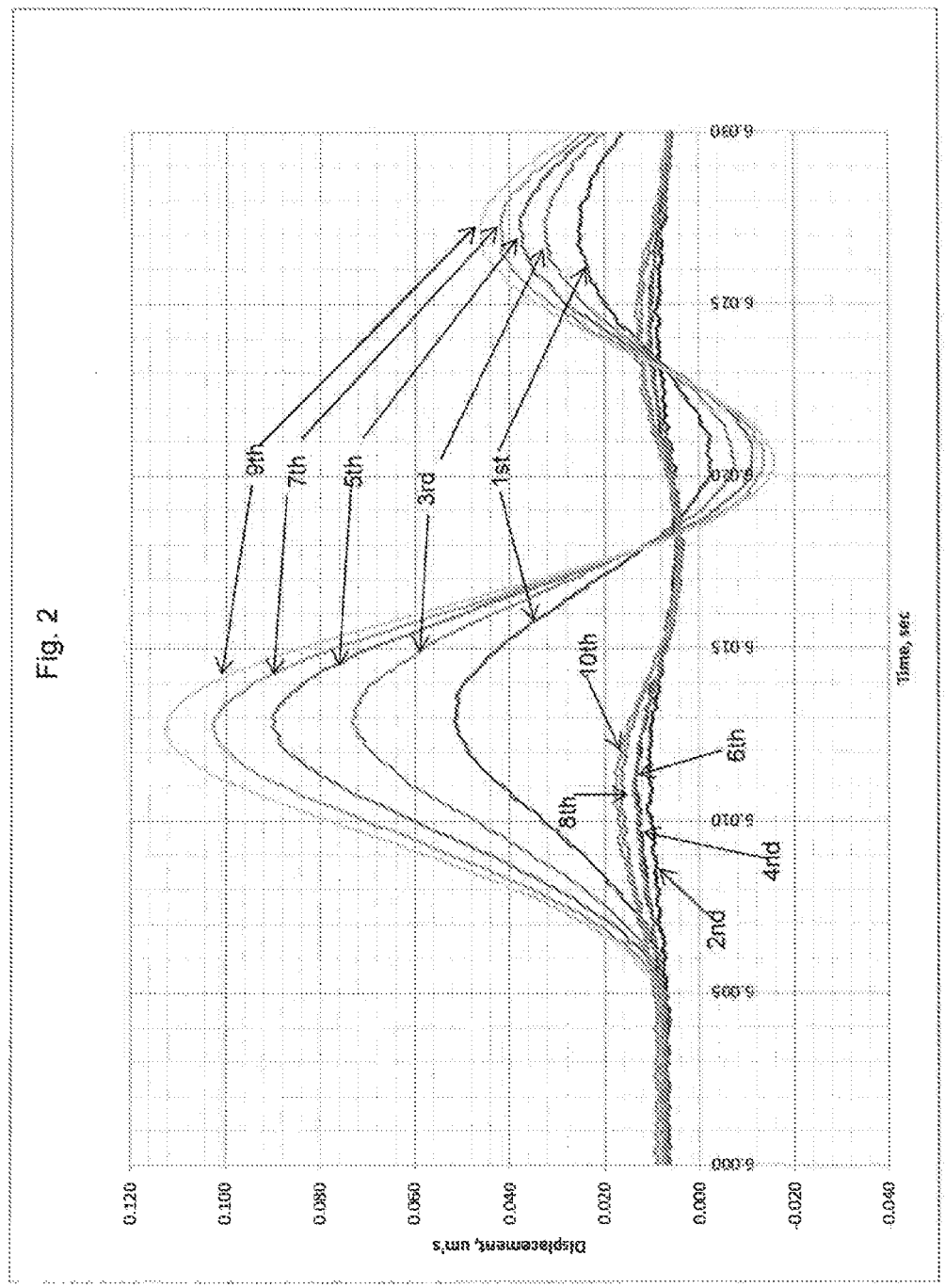
FIG. 2 is a plot showing displacement vs. time vs. cycle with alternating polarity.

FIG. 2, a plot depicting displacement vs. time vs. cycle with alternating polarity for 10 cycles, shows that displacement is observed only during the odd (positive polarity) cycles. Little or no displacement is observed during the even (negative polarity) cycles.

FIGS. 3A, 3B and 3C illustrate a possible mechanism of the present invention. There are orders of magnitude difference in the diffusivities of the anions and cations. The polarity effect is not seen with anion/cation pairs that are more comparable in size and diffusivities As shown in FIG. 3A, with no voltage flowing, anions 30 and cations 32, are associated with each other. One electrode is grounded 36; the other is active 34 and has high resistance. Charging is current limited—it takes a finite amount of time to transfer charge (electrons) onto the high resistance electrodes.

As shown in FIG. 3B, when imposing a negative voltage, electrons are transferred to the active electrode 34 (rather than to the grounded electrode 36). The cations 32 can diffuse almost instantaneously and are in sufficient quantity to balance the incoming electrons. The rest of the material in the capacitor stack does not experience an electric field.

When imposing a positive voltage as depicted in FIG. 3C, electrons are removed from the active electrode 34 faster than the large anions 30 can diffuse, enabling the imposition of an electric field across the pair of electrodes (34, 36).

The opposite polarity effect should occur when the anions 30 diffuse more easily than the cations 32.

Figure 4:
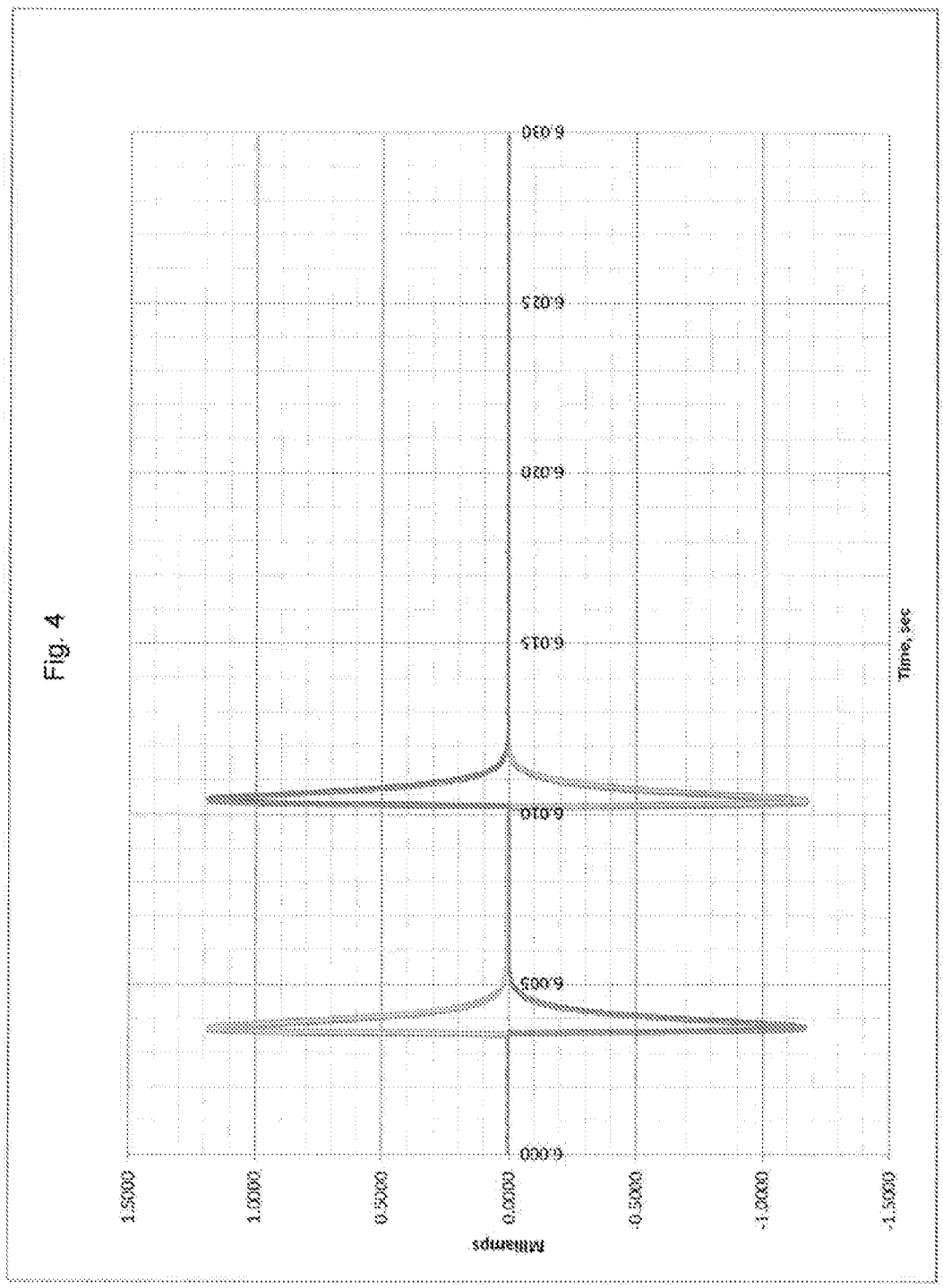
FIG. 4 provides a plot of current vs. time vs. cycle for a standard electrode material with alternating polarity for 10 cycles.
Figure 5:
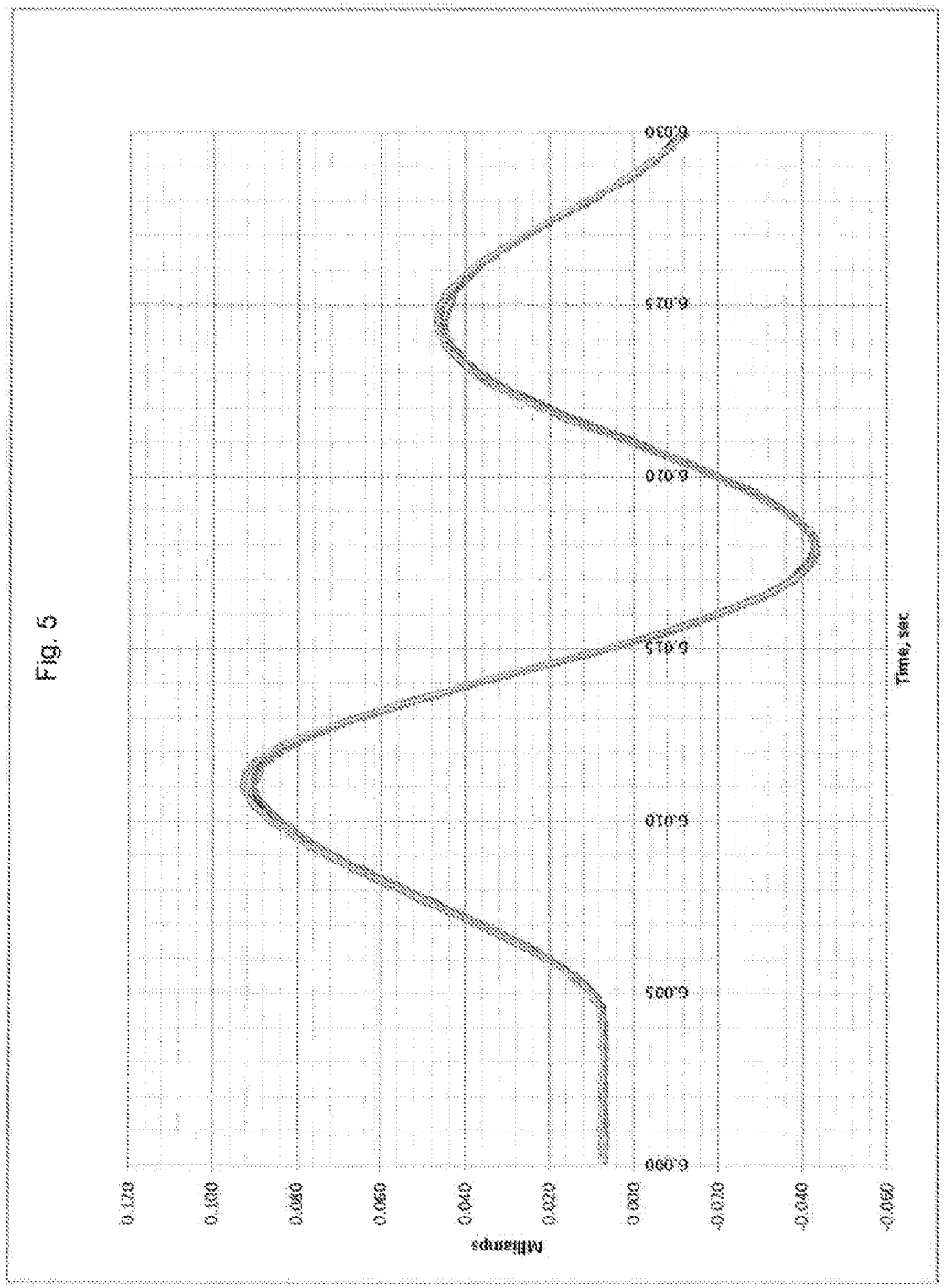
FIG. 5 shows a plot of displacement vs, time vs. cycle for 10 cycles.

FIG. 4 provides a plot of current vs. time vs. cycle for a standard electrode material with alternating polarity and FIG. 5 shows a plot of displacement vs. time vs. cycle for 10 cycles. As can be appreciated by reference to FIGS. 4 and 5, the lines for the first through $10^{th}$ cycles essentially overlay each other. The same response to either positive or negative polarity was observed.

Figure 6:
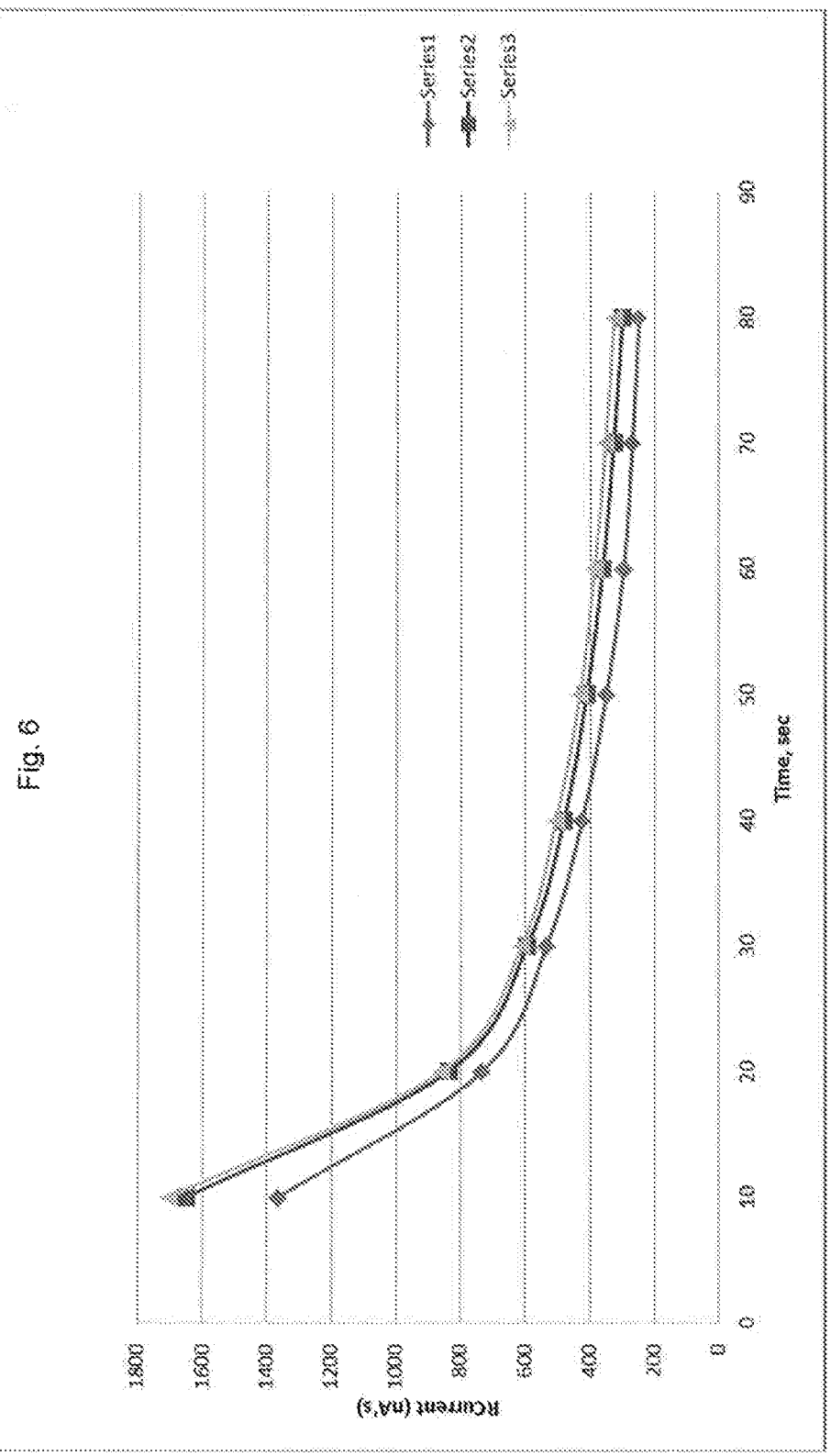
FIG. 6 is a plot of current vs. time at voltage.
Figure 7:
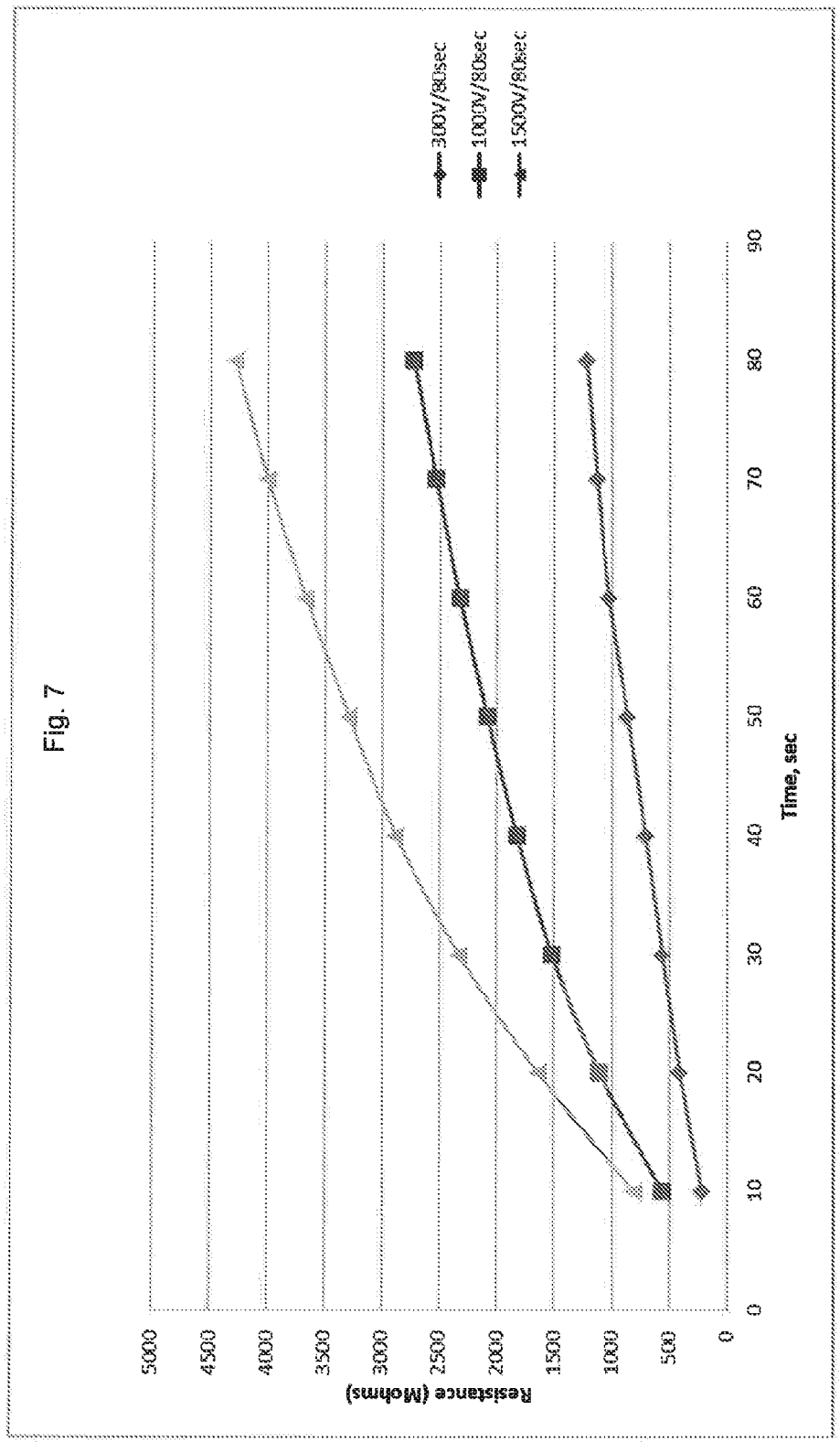
FIG. 7 converts the data from FIG. 6 to a plot of resistance vs. time.

FIGS. 6 and 7 show plots of current vs. time and resistance vs. time for samples conditioned at different voltages for 80 seconds. As can be appreciated by reference to FIGS. 6 and 7, there seems to be charge transfer.

Figure 8:
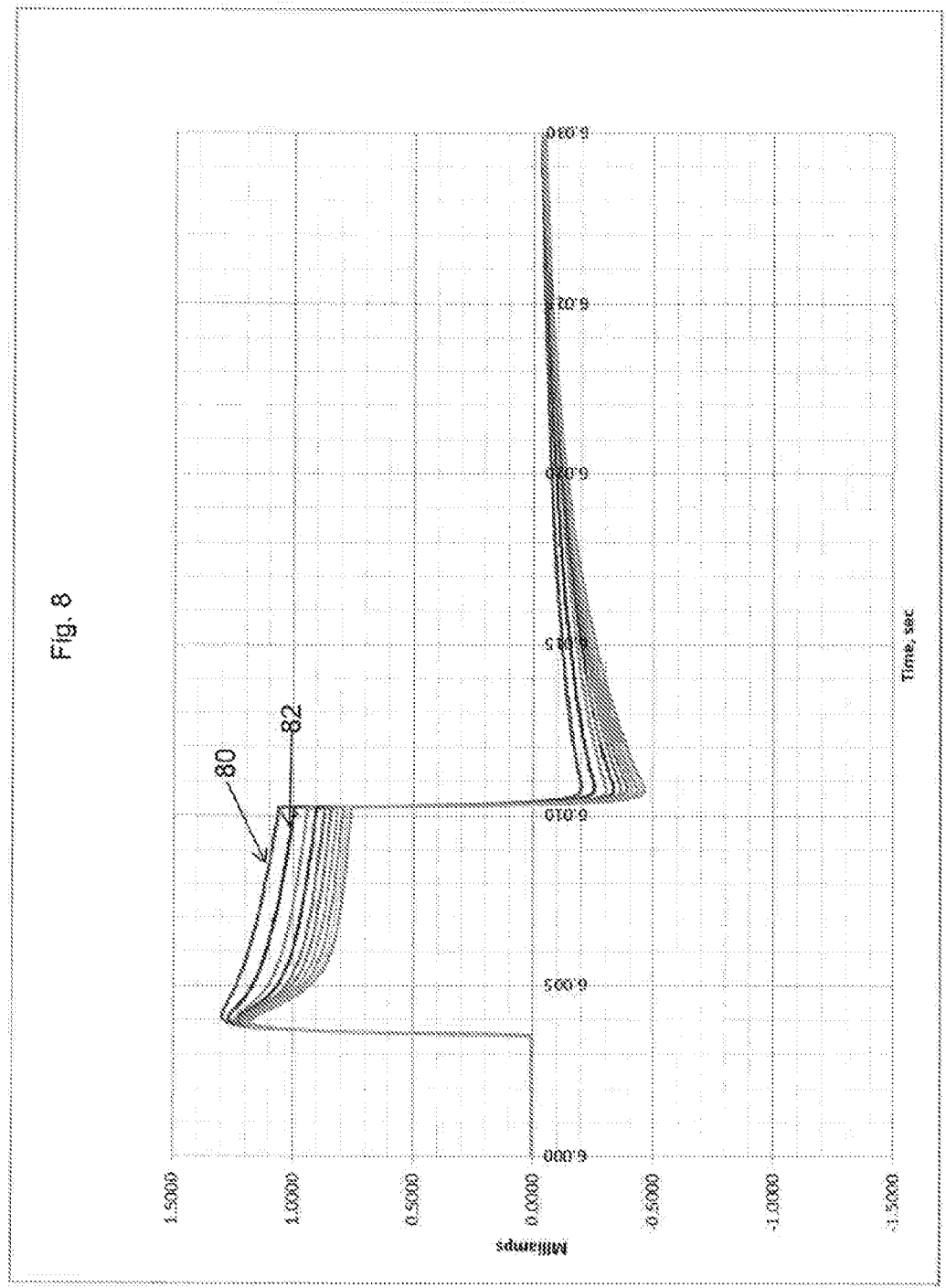
FIG. 8 shows the response to positive polarity pulses with a plot of current vs. time vs. cycles.
Figure 9:
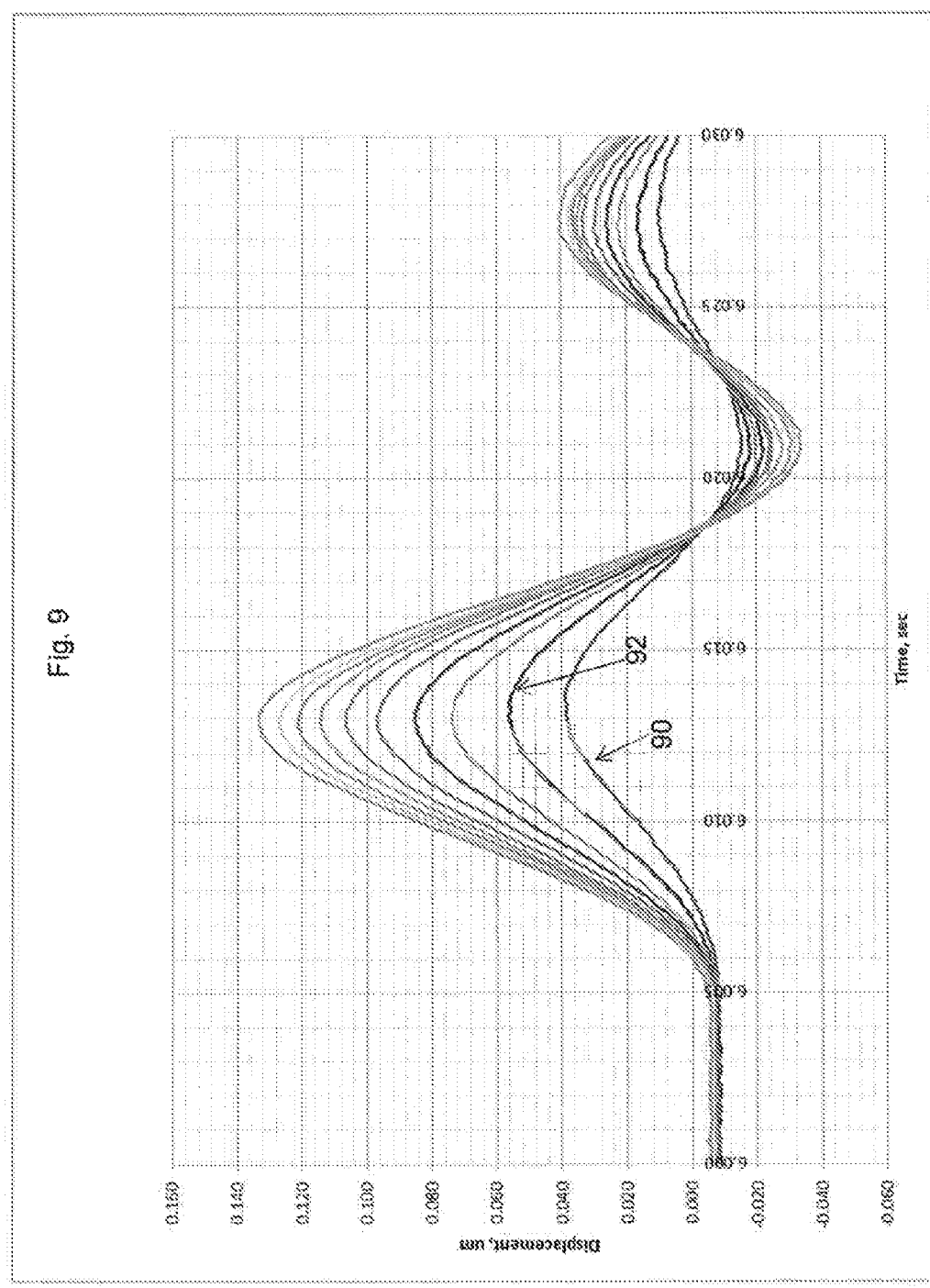
FIG. 9 shows the response to positive polarity pulses with a plot of displacement vs. time vs. cycle.

FIGS. 8 and 9 show the response to positive polarity pulses with FIG. 8 showing a plot of current vs. time vs. cycles with the first pulse 80 being uppermost, the second 82 below that, etc. FIG. 9 provides a plot of displacement vs. time vs. cycle with the first pulse 90 being the lowermost line, the second pulse 92 being directly above that, etc. As can be appreciated by reference to FIGS. 8 and 9, the material converts from a resistor to a capacitor.

Figure 10:
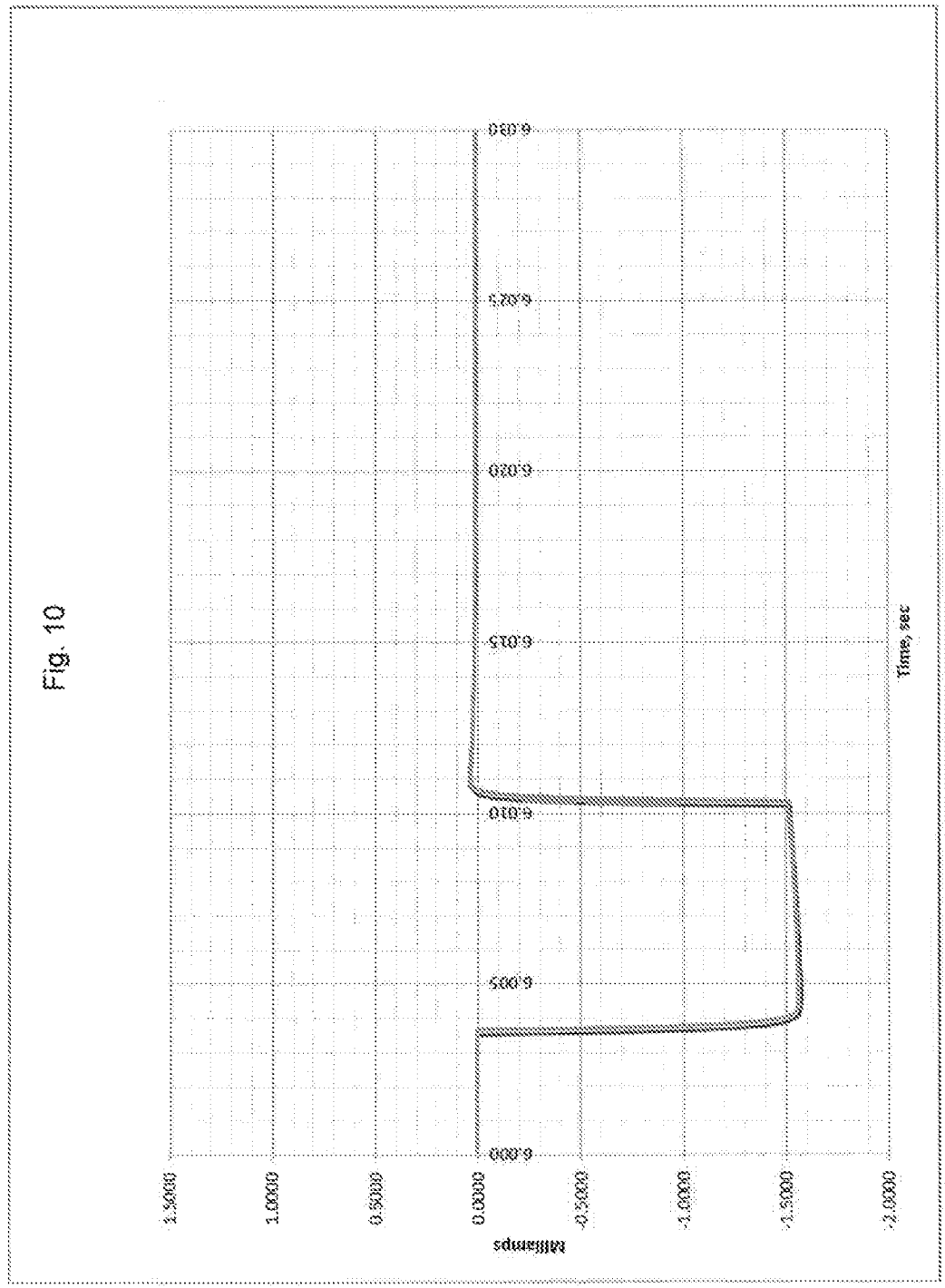
FIG. 10 illustrates response to negative polarity pulses with a plot of current vs. time vs. cycles.
Figure 11:
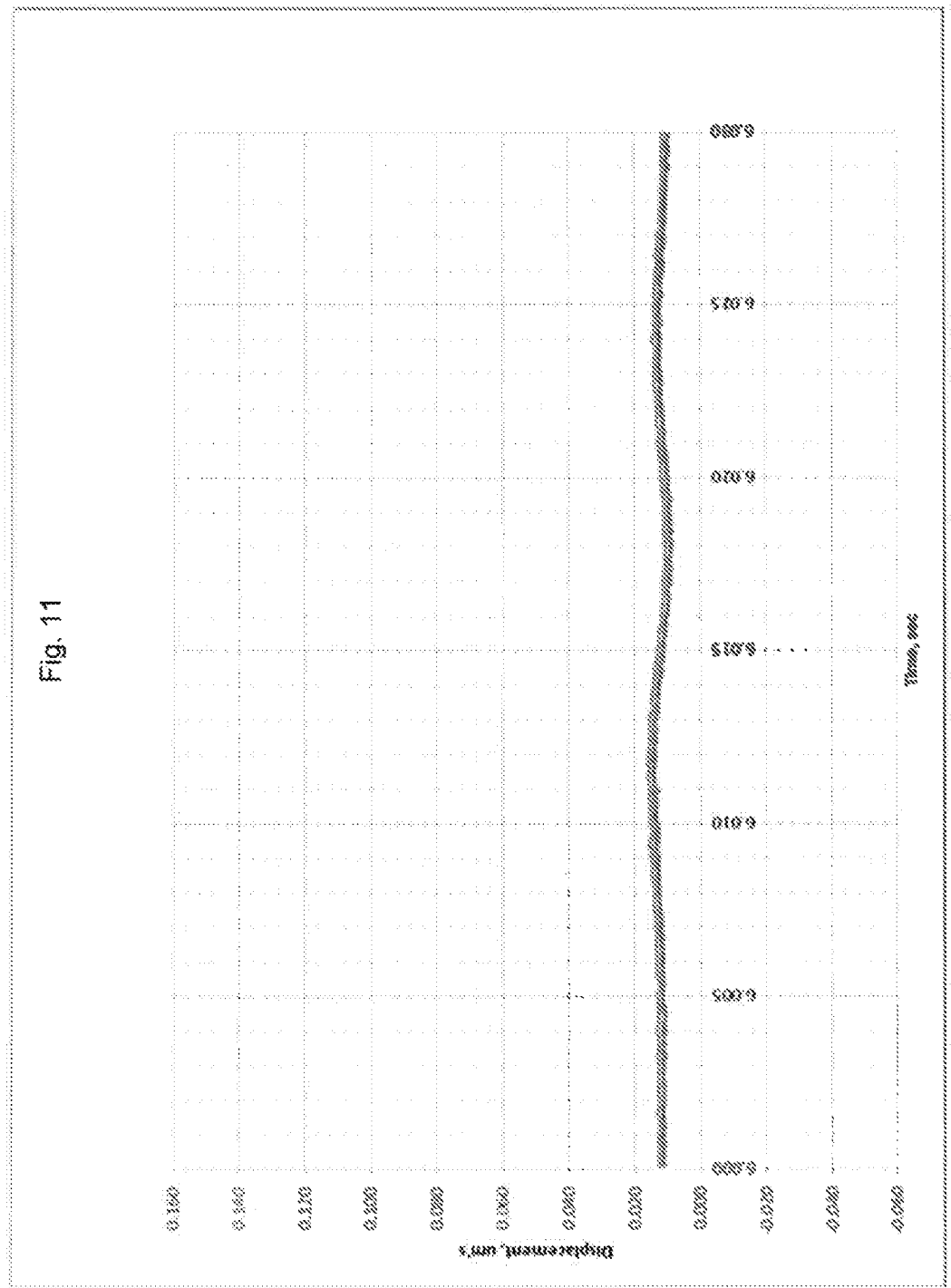
FIG. 11 illustrates response to negative polarity pulses with a plot of displacement vs. time vs. cycle.

FIGS. 10 and 11 illustrate response to negative polarity pulses. FIG. 10 is a plot of current vs. time vs. cycles and FIG. 11 is a plot of displacement vs. time vs. cycle. As can be appreciated by reference to FIGS. 10 and 11, the material remains a resistor, there is no displacement.

Figure 12:
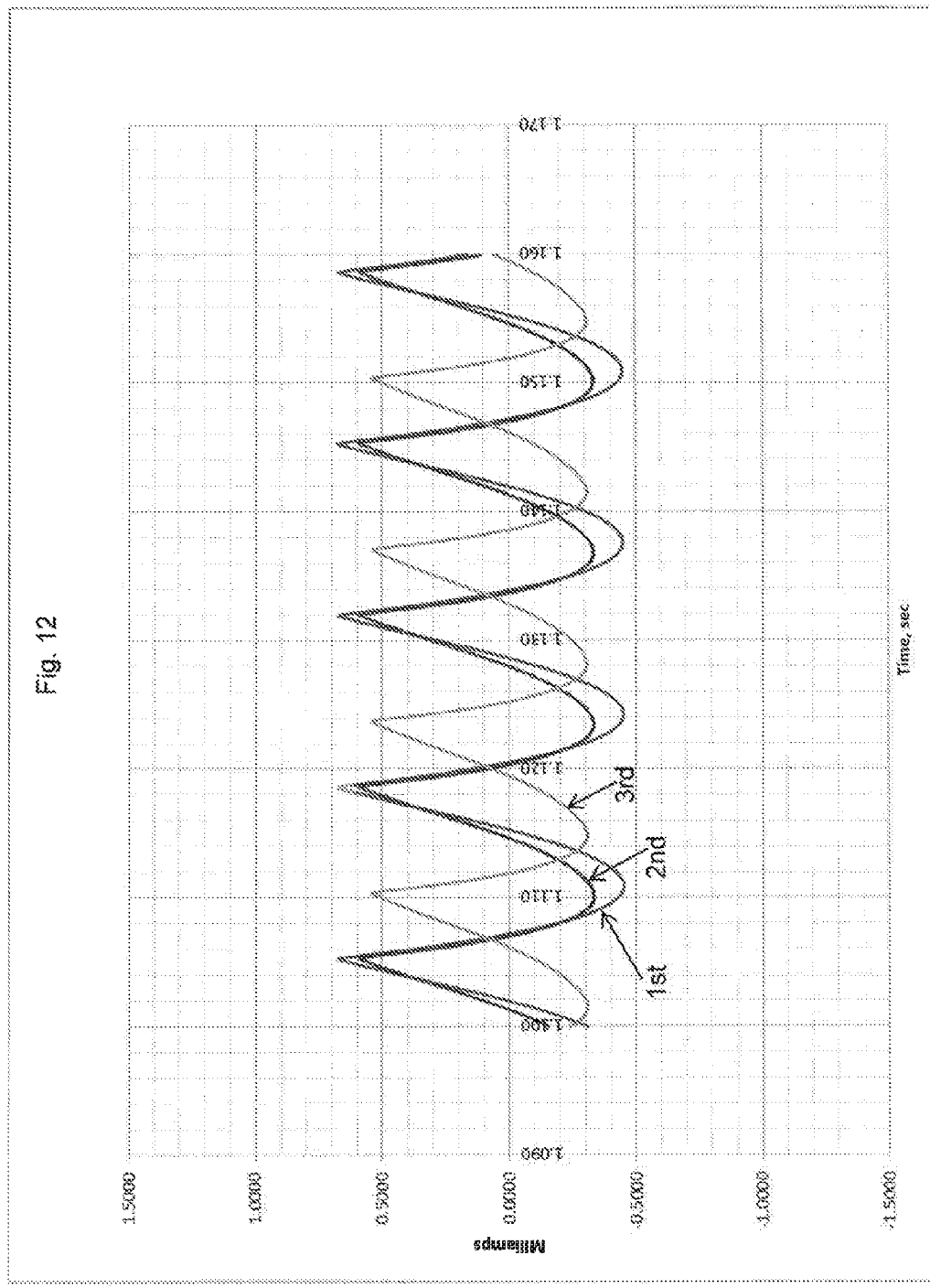
FIG. 12 shows response to cyclic negative polarity with a plot of current vs. time vs. cycles.
Figure 13:
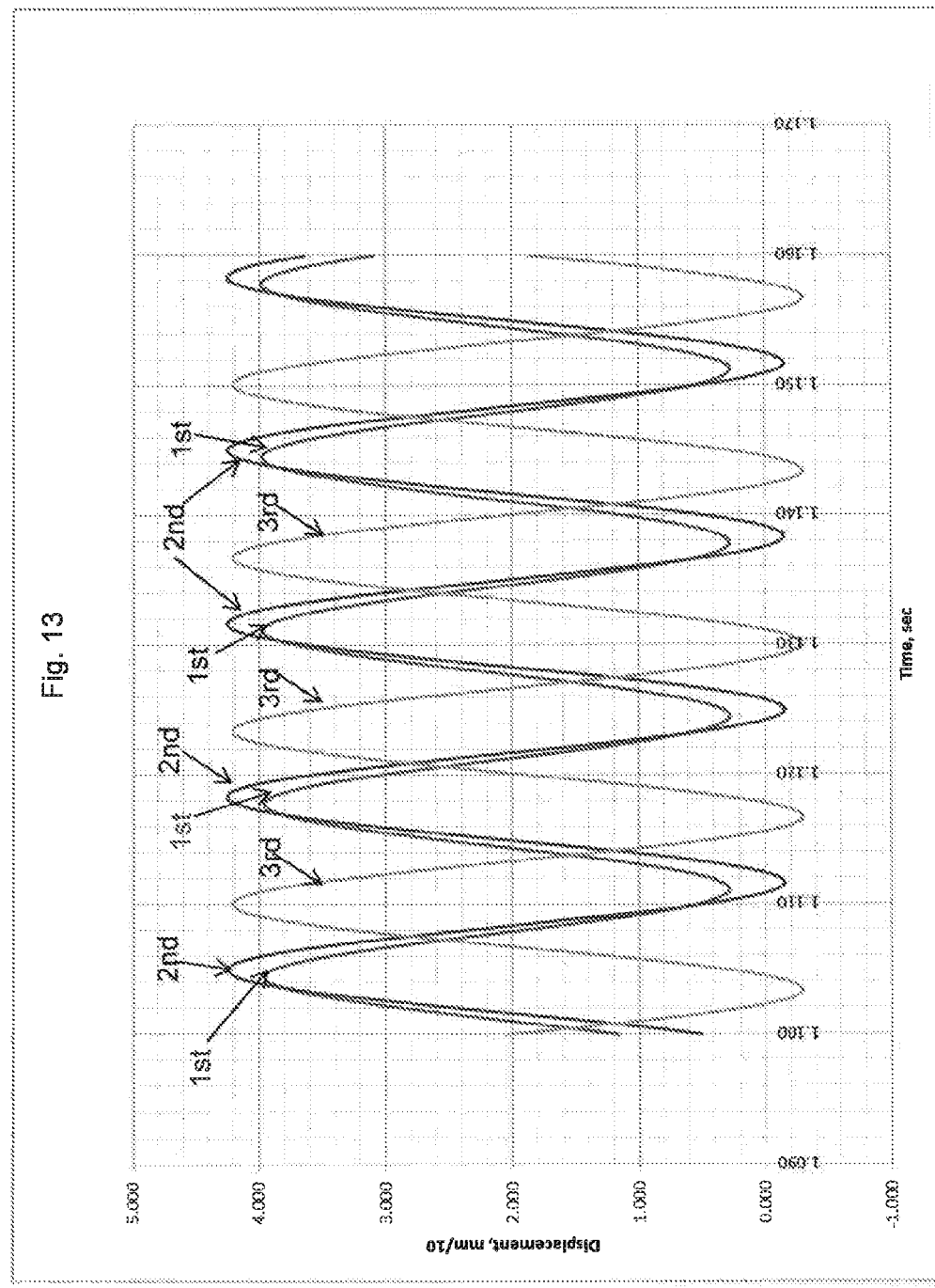
FIG. 13 shows response to cyclic negative polarity with a plot of displacement vs. time vs. cycle.

FIGS. 12 and 13 show response to cyclic negative polarity. FIG. 12 is a plot of current vs. time vs. cycles and FIG. 13 is a plot of displacement vs. time vs. cycle. The conditions were 75 Hz for 15 sec; negative polarity; data taken at 1 sec., 7 sec. and 14 sec. As can be appreciated from FIGS. 12 and 13 the material appears to condition quickly.

Figure 14:
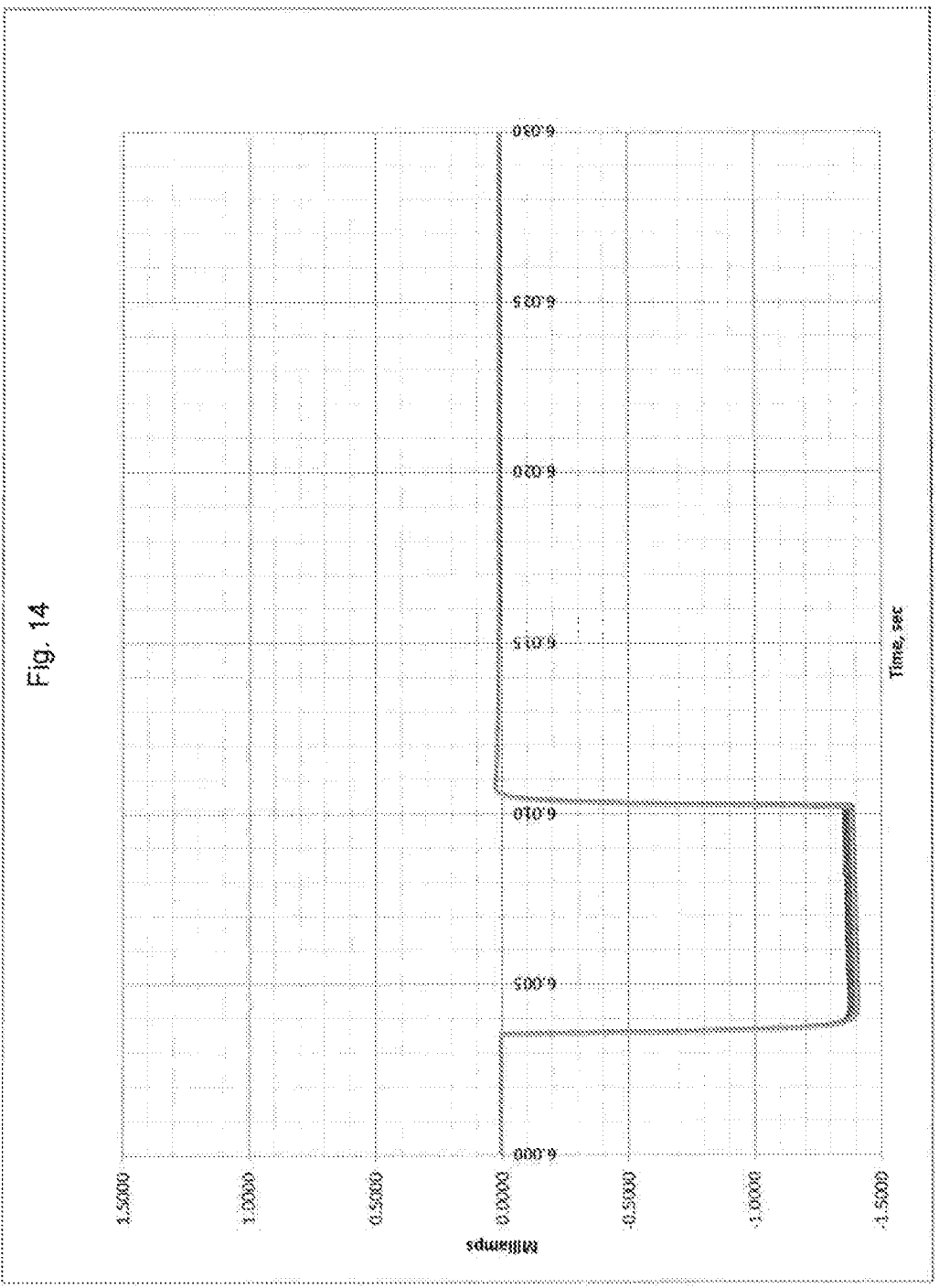
FIG. 14 illustrates pulse response to cyclic negative polarity with a plot of current vs. time vs. cycles.
Figure 15:
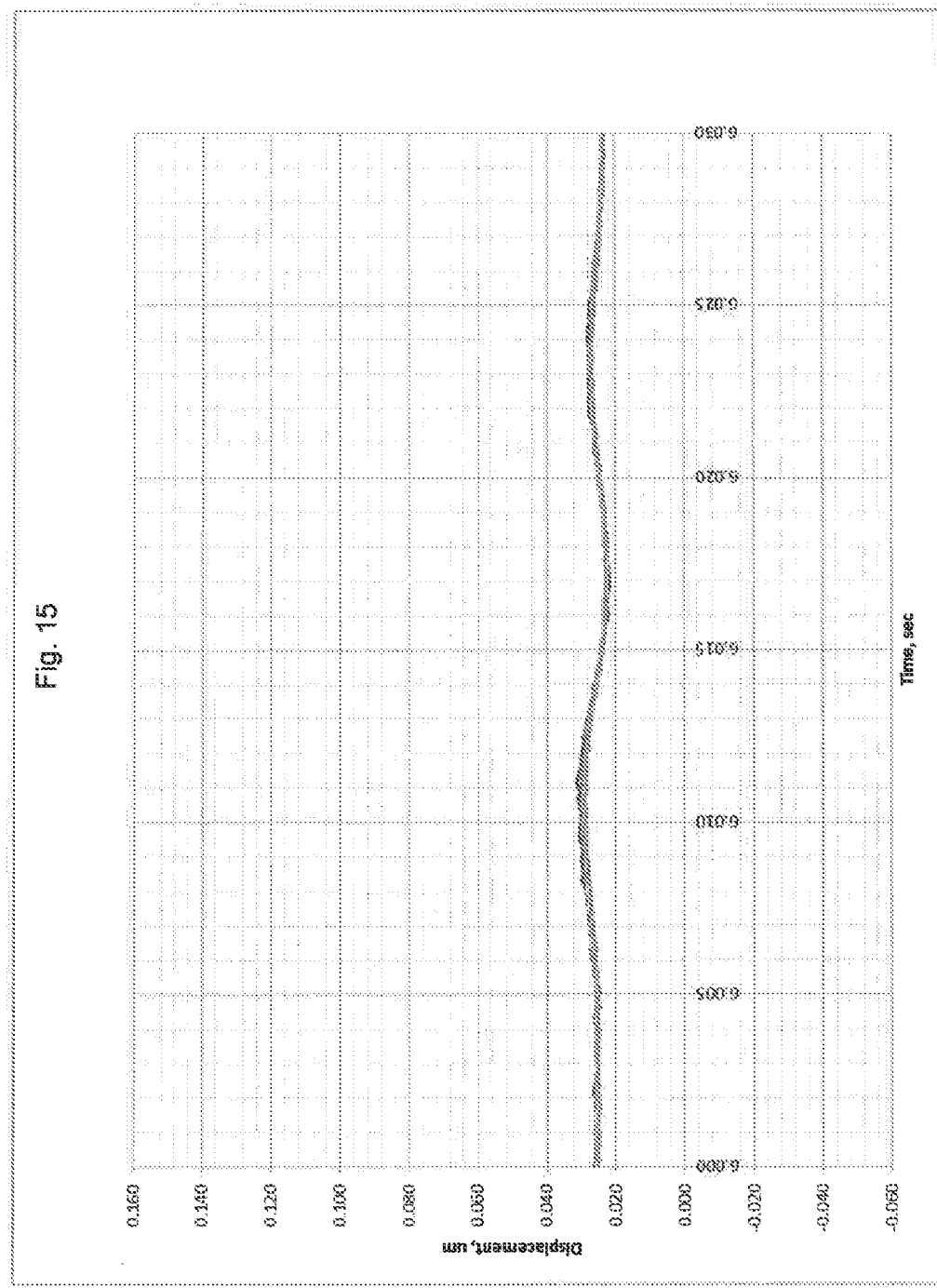
FIG. 15 illustrates pulse response to cyclic negative polarity with a plot of displacement vs. time vs. cycle.

FIGS. 14 and 15 illustrate pulse response to cyclic negative polarity, 10 pulses with negative polarity. The material immediately reverts back to a resistor. FIG. 14 is a plot of current vs. time vs. cycles and FIG. 15 is a plot of displacement vs. time vs. cycle.

Figure 16:
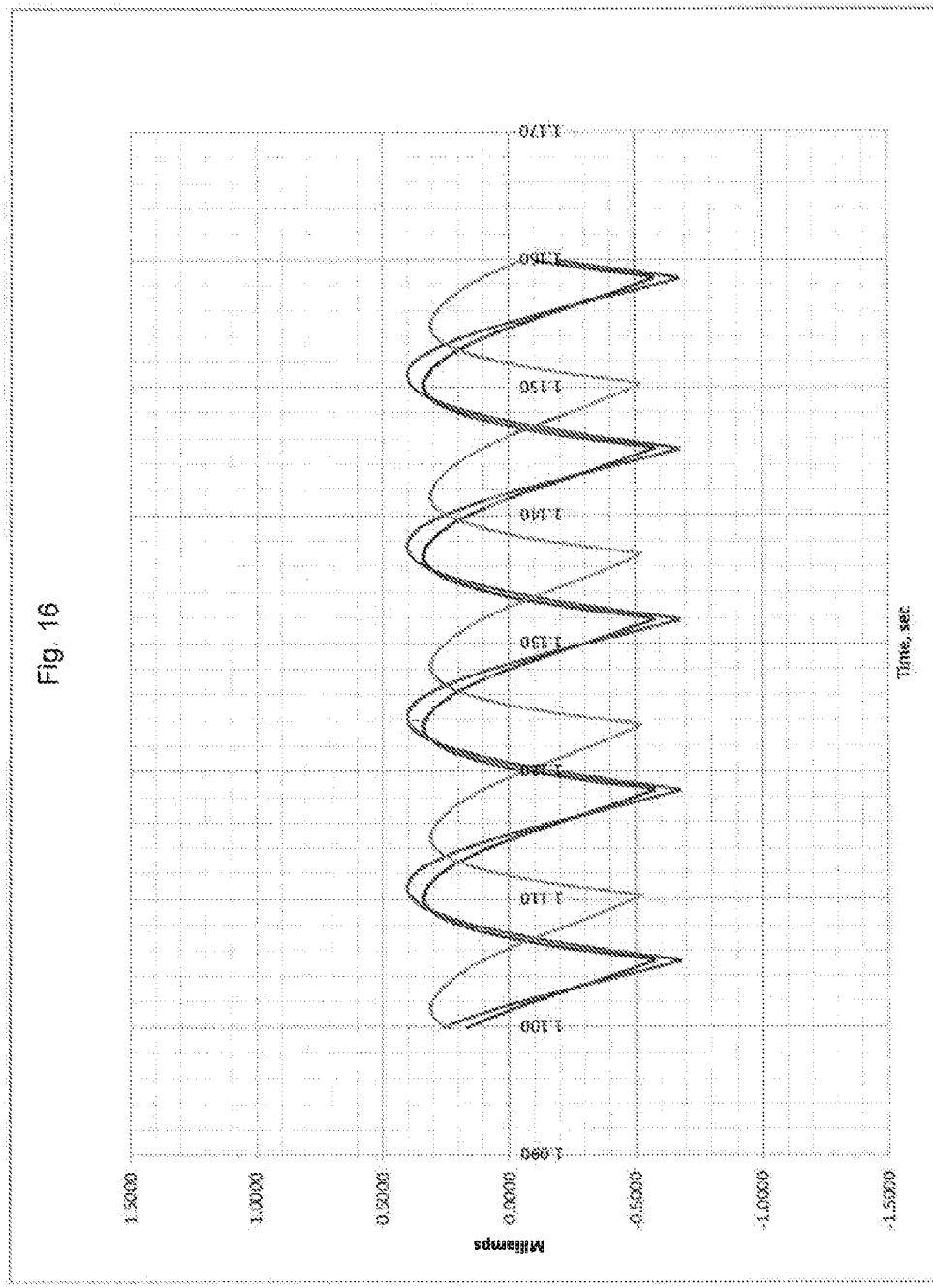
FIG. 16 shows response to cyclic positive polarity with a plot of current vs. time vs. cycles.
Figure 17:
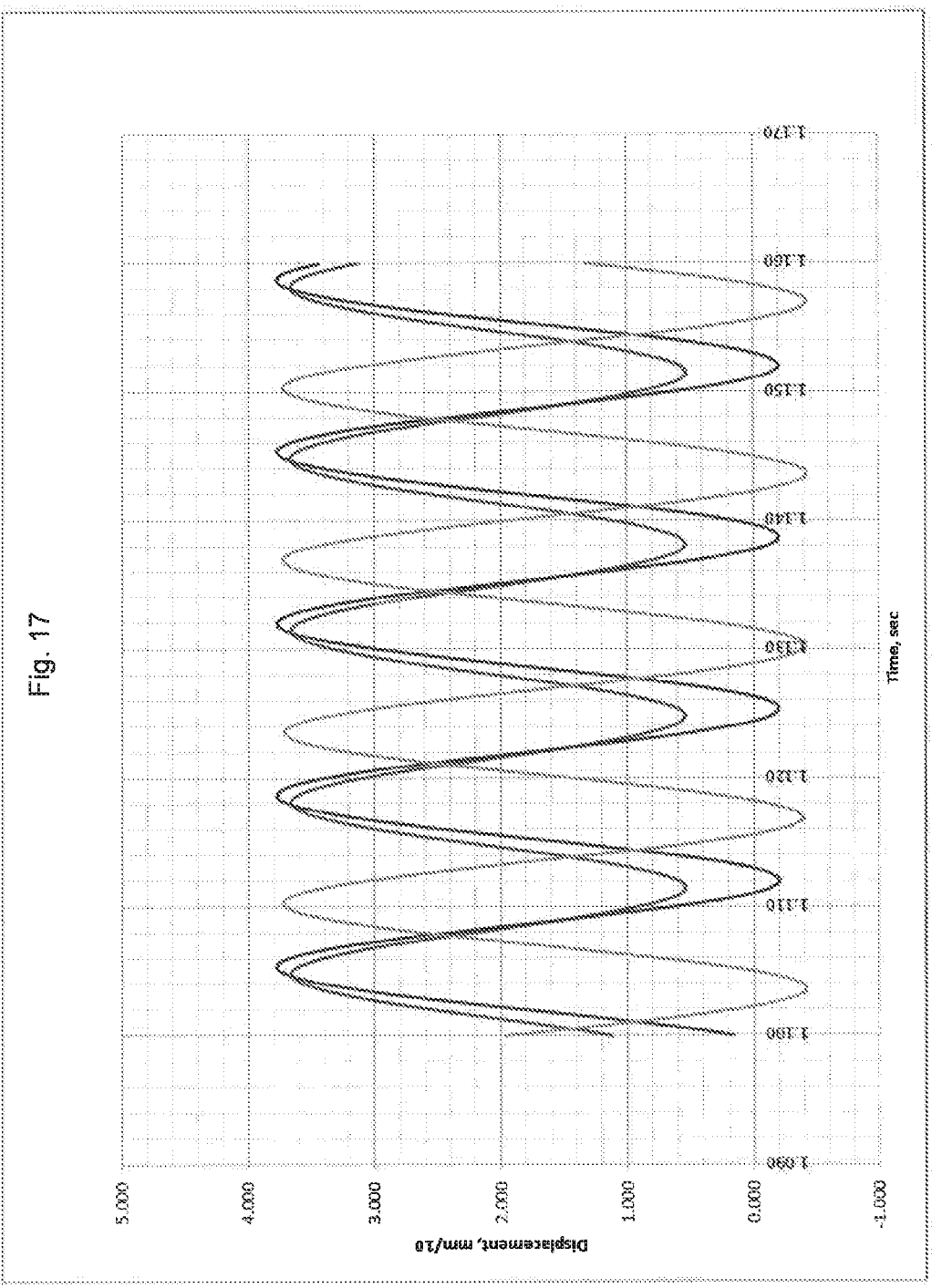
FIG. 17 shows response to cyclic positive polarity with a plot of displacement vs. time vs. cycle.

FIGS. 16 and 17 show response to cyclic positive polarity. Conditions were: 75 Hz for 15 sec; positive polarity; data taken at 1 sec., 7 sec. and 14 sec. FIG. 16 is a plot of current vs. time vs. cycles and FIG. 17 is a plot of displacement vs. time vs. cycle. As can be appreciated by reference to FIGS. 16 and 17, the material appeared to condition quickly.

Figure 18:
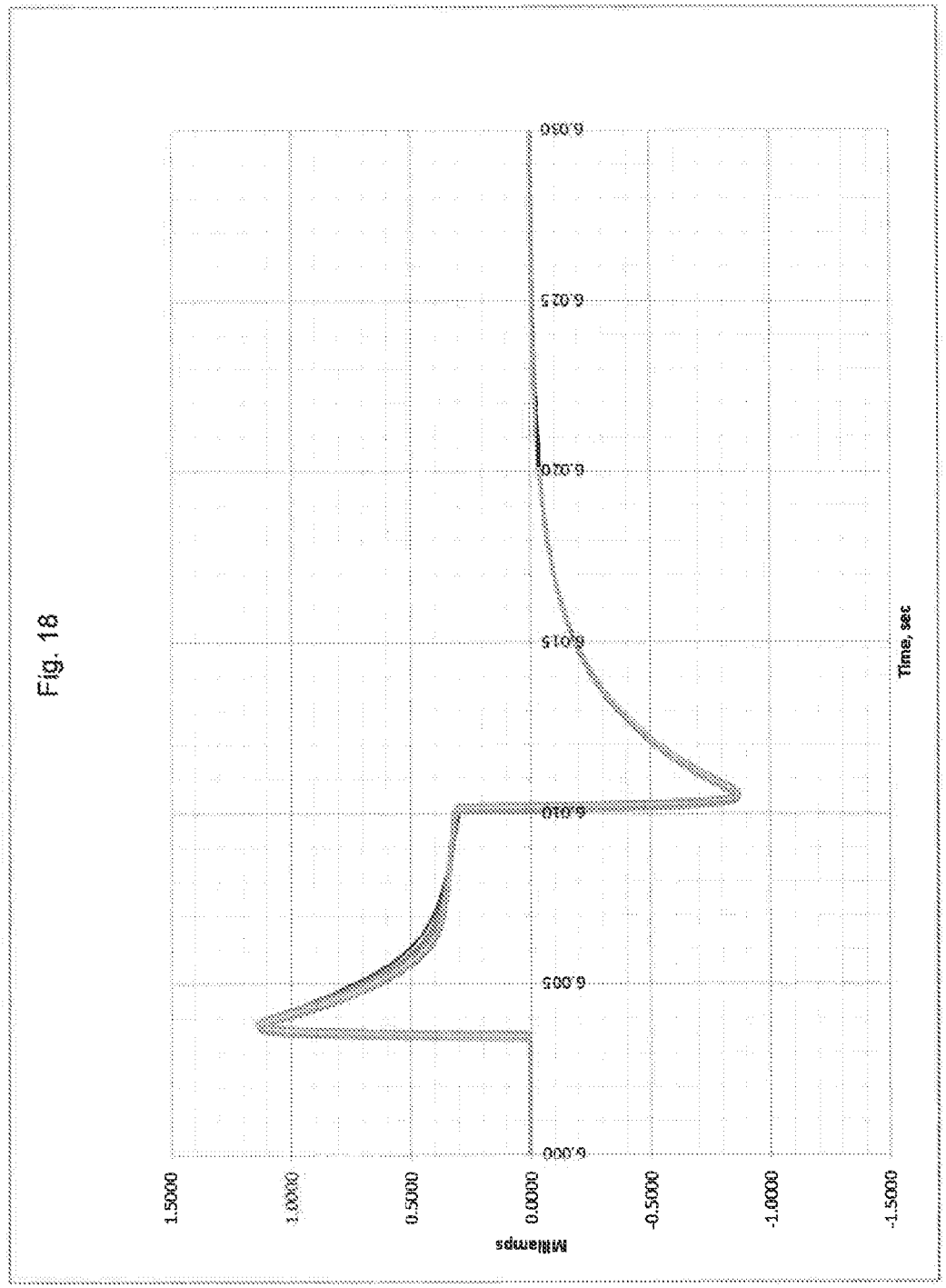
FIG. 18 illustrates pulse response to cyclic positive polarity with a plot of current vs. time vs. cycles.
Figure 19:
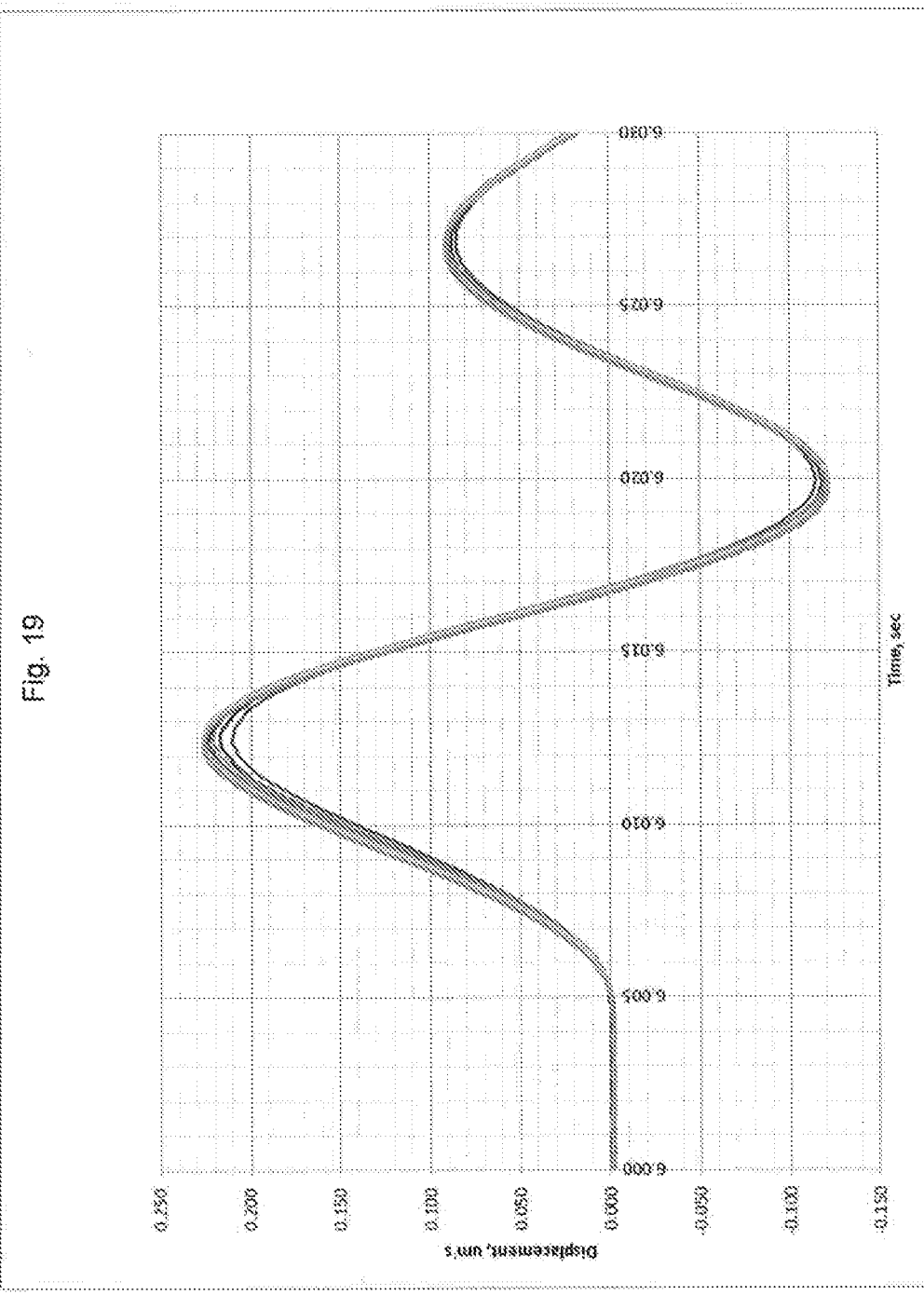
FIG. 19 illustrates pulse response to cyclic positive polarity with a plot of displacement vs. time vs. cycle.

FIGS. 18 and 19 illustrate pulse response to cyclic positive polarity. 10 pulses with positive polarity. FIG. 18 is a plot of current vs. time vs. cycles and FIG. 19 is a plot of displacement vs. time vs. cycle. As can be appreciated by reference to FIGS. 16 and 17, the material remained conditioned.

An exemplary application of the present invention is as a component in an electrical circuit. A positive voltage applied across the polymer diode results in a displacement of a portion of the diode which mechanically closes a switch or relay elsewhere in the circuit. If the voltage has a negative polarity, no displacement of the polymer diode occurs and there is no change in the state of the circuit.

Various aspects of the subject matter described herein are set o in the thllowing numbered clauses in any combination thereof:

1. A flexible polymer diode comprising: a dielectric elastomer material; a first electrode material on a first side of the dielectric elastomer material; and a second electrode material on a second side of the dielectric elastomer material.

2. The flexible polymer diode according to claim 1 further including an electrically active additive.

3. The flexible polymer diode according to claim 2, wherein the electrically active additive comprises one or more compounds selected from the group consisting of ionic salts, iodonium salts and sulthnium salts.

4. The flexible polymer diode according to claim 2, wherein the electrically active additive comprises one or more compounds selected from the group consisting of (4-tert-Butylphenyl) diphenyl sulfonium triflate, Tris(pentafluorophenyl)boron, 4-isopropyl-4'-methyldiphenyliodonium tetrakis(pentafluorophenyl)borate, Sodium tetraphenylborate, sodium tetrakis[3,5-bis(trifluoromethyl)phenyl]borate, bis(4-tert-butylphenyl)iodonium triflate, tris({4-[(4-acetylphenyl)sulfanyl]phenyl})sulfanium tetrakis(pentafluorophenyl)borate, sodium chloride and a phthalocyanine.

The foregoing examples of the present invention are offered for the purpose of illustration and not limitation. It will be apparent to those skilled in the art that the embodiments described herein may be modified or revised in various ways without departing from the spirit and scope of the invention. The scope of the invention is to be measured by the appended claims.

What is claimed is:

1. A flexible polymer diode comprising:
a dielectric elastomer material;
a first electrode material on a first side of the dielectric elastomer material; and
a second electrode material on a second side of the dielectric elastomer material,
wherein the dielectric eleastomer material is configured to pass an electrical current having a first polarity from the first electrode material to the second electrode material and is configured not to pass an electrical current having a polarity opposite to the first polarity from the first electrode material to the second electrode material.

2. The flexible polymer diode according to claim 1, further comprising an electrically active additive material.

3. The flexible polymer diode according to claim 2, wherein the electrically active additive material comprises one or more compounds selected from the group consisting of ionic salts, iodonium salts and sulfonium salts.

4. The flexible polymer diode according to claim 2, wherein the electrically active additive material comprises one or more compounds selected from the group consisting of (4 tertButylphenyl)diphenyl sulfonium triflate, Tris(pentafluorophenyl) boron, 4-isopropyl-4'methyldiphenyliodonium tetrakis(pentafluorophenyl)borate, Sodium tetraphenylborate, sodium tetrakis[3,5-bis(trifluoromethyl)phenyl]

borate, bis(4-tert-butylphenyl) iodonium triflate, tris({4-[(4-acetylphenyl)sulfanyl]phenyl})sulfanium tetrakis(pentafluorophenyl)borate, sodium chloride and a phthalocyanine.

5. The flexible polymer diode according to claim 2, wherein one of the first electrode material or the second electrode material comprises the electrically active additive material.

6. The flexible polymer diode according to claim 5, wherein the electrically active additive material comprises one or more compounds selected from the group consisting of ionic salts, iodonium salts and sulfonium salts.

7. The flexible polymer diode according to claim 5, wherein the electrically active additive material comprises one or more compounds selected from the group consisting of (4-tert-Butylphenyl) diphenyl sulfonium triflate, Tris (pentafluorophenyl) boron, 4-isopropyl-4'methyldiphenyliodonium tetrakis(pentafluorophenyl)borate, Sodium tetraphenylborate, sodium tetrakis[3,5-bis(trifluoromethyl) phenyl]borate, bis(4-tert-butylphenyl) iodonium triflate, tris ({4-[(4-acetylphenyl)sulfanyl]phenyl})sulfanium tetrakis (penta-fluorophenyl) borate, sodium chloride and a phthalocyanine.

8. The flexible polymer diode according to claim 2, wherein the electrically active additive material comprises a functional group that reacts with the dielectric elastomer material to limit a diffusivity of the electrically active additive.

9. The flexible polymer diode according to claim 2, wherein the electrically active additive material is a compound that is photo labile or thermally labile.

10. The flexible polymer diode according to claim 2, wherein the electrically active additive material comprises sodium tetrakis[3,5-bis(trifluoromethyl) phenyl]borate.

11. The flexible polymer diode according to claim 2, wherein one of the first electrode material or the second electrode material is grounded.

12. The flexible polymer diode according to claim 11, wherein the one of the first electrode material or the second electrode material that is grounded is a grounded electrode material, and wherein a negative voltage is applied to one of the first electrode material or the second electrode material that is not grounded.

13. The flexible polymer diode according to claim 11, wherein the one of the first electrode material or the second electrode material that is grounded is a grounded electrode material, and wherein a positive voltage is applied to one of the first electrode material or the second electrode material that is not grounded.

14. The flexible polymer diode according to claim 2, wherein a voltage with alternating polarity is applied to one of the first electrode material or the second electrode material.

15. The flexible polymer diode according to claim 1, wherein the dielectric elastomer material comprises a photo treated material or a thermally treated material.

16. The flexible polymer diode according to claim 15, wherein the electrically active additive material comprises fragments of the dielectric elastomer material.

17. The flexible polymer diode according to claim 16, wherein the fragments of the dielectric elastomer material are configured to react with a functional group in the dielectric matrix material.

18. The flexible polymer diode according to claim 1, wherein the dielectric elastomer material comprises a permanent compositional gradient.

19. The flexible polymer diode according to claim 1, wherein at least one of the first electrode material and the second electrode material are coupled to an electrical circuit.

* * * * *